United States Patent [19]
Unami et al.

[11] Patent Number: 5,912,601
[45] Date of Patent: *Jun. 15, 1999

[54] PIEZOELECTRIC RESONATOR AND ELECTRONIC COMPONENT CONTAINING SAME

[75] Inventors: Toshihiko Unami; Jiro Inoue, both of Omihachiman, Japan

[73] Assignee: Murata Manufacturing Co. Ltd., Kyoto-Fu, Japan

[*] Notice: This patent is subject to a terminal disclaimer.

[21] Appl. No.: 08/846,740

[22] Filed: Apr. 30, 1997

[30] Foreign Application Priority Data

Jul. 18, 1996 [JP] Japan ................... 8-208857
Jan. 10, 1997 [JP] Japan ................... 9-014584

[51] Int. Cl.$^6$ .................. H03H 9/205; H03H 9/10; H03H 9/54
[52] U.S. Cl. .................. 333/187; 333/189; 310/321; 310/348; 310/357; 310/366
[58] Field of Search ................... 333/186–192; 310/311, 321, 328, 348, 357, 359, 366

[56] References Cited

U.S. PATENT DOCUMENTS

| | | | |
|---|---|---|---|
| 2,157,665 | 5/1939 | Hollmann | 310/315 |
| 3,185,869 | 5/1965 | Shoor | 310/315 |
| 3,297,889 | 1/1967 | Breskend | 310/315 |
| 3,401,275 | 9/1968 | Curran et al. | |
| 3,590,287 | 6/1971 | Berlincourt et al. | 310/366 X |
| 4,087,716 | 5/1978 | Haywang | 310/359 X |
| 4,360,754 | 11/1982 | Toyoshima et al. | 310/366 |
| 4,398,117 | 8/1983 | St. Cyr | 310/348 |
| 4,503,352 | 3/1985 | Inoue | 333/187 X |
| 4,532,451 | 7/1985 | Inoue | 310/353 |
| 4,542,315 | 9/1985 | Yamamoto et al. | 310/348 |
| 4,564,782 | 1/1986 | Ogawa | 310/359 |
| 4,570,098 | 2/1986 | Tomita et al. | 310/346 |
| 4,633,120 | 12/1986 | Sato et al. | 310/328 |
| 4,642,510 | 2/1987 | Yamashita | 310/348 |
| 4,656,385 | 4/1987 | Tanaka | 310/348 |
| 4,752,712 | 6/1988 | Tomita et al. | 310/328 |
| 4,759,107 | 7/1988 | Ogawa et al. | 310/328 X |
| 4,780,639 | 10/1988 | Shirasu | 310/328 |
| 4,885,498 | 12/1989 | Wakita | 310/328 |
| 5,045,744 | 9/1991 | Ando et al. | 310/366 X |
| 5,118,982 | 6/1992 | Inoue et al. | 310/328 X |
| 5,126,618 | 6/1992 | Takahashi et al. | 310/346 |
| 5,153,477 | 10/1992 | Jomura et al. | 310/366 X |
| 5,225,731 | 7/1993 | Owen | 310/366 |
| 5,233,256 | 8/1993 | Hayashi et al. | 310/317 |
| 5,237,239 | 8/1993 | Inoue et al. | 310/328 |
| 5,241,236 | 8/1993 | Sasaki et al. | 310/358 |
| 5,250,870 | 10/1993 | Fenlon et al. | 310/345 |
| 5,381,067 | 1/1995 | Greenstein | 310/359 X |
| 5,438,232 | 8/1995 | Inoue et al. | 310/328 |
| 5,446,485 | 8/1995 | Usui | 347/72 |
| 5,517,073 | 5/1996 | Ohkuma | 310/315 |
| 5,523,645 | 6/1996 | Inoi | 310/328 X |

(List continued on next page.)

FOREIGN PATENT DOCUMENTS 5-160459  6/1993  Japan ................... 310/366

*Primary Examiner*—Robert Pascal
*Assistant Examiner*—Barbara Summons
*Attorney, Agent, or Firm*—Graham & James LLP

[57] ABSTRACT

A piezoelectric resonator has a substantially rectangular-parallelpiped-shaped base member. The base member includes a plurality of laminated piezoelectric layers. The piezoelectric layers are polarized in the longitudinal direction of the base member such that the direction of polarization differs at adjacent piezoelectric layers. At opposite major surfaces of the plurality of piezoelectric layers, internal electrodes are disposed. The internal electrodes have surface areas with different sizes and therefore, areas of pairs of opposing electrodes have different sizes. The internal electrodes are alternately covered by at least two insulating films provided on opposing side surfaces of the base member. The at least two insulating films cover different internal electrodes. External electrodes are disposed on the same or the opposing side surfaces of the base member and the external electrodes are connected to the internal electrodes.

16 Claims, 21 Drawing Sheets

U.S. PATENT DOCUMENTS

| | | | |
|---|---|---|---|
| 5,525,944 | 6/1996 | Oyama | 333/189 |
| 5,548,179 | 8/1996 | Kaida | 310/348 X |
| 5,565,824 | 10/1996 | Nagano | 333/189 |
| 5,572,082 | 11/1996 | Sokol | 310/366 |
| 5,585,687 | 12/1996 | Wakabayashi et al. | 310/366 |
| 5,596,243 | 1/1997 | Tsuru et al. | 310/348 |
| 5,596,244 | 1/1997 | Kugou et al. | 310/348 |
| 5,696,472 | 12/1997 | Kaida | 333/189 |
| 5,705,880 | 1/1998 | Shimura et al. | 310/366 |
| 5,717,365 | 2/1998 | Kaida et al. | 333/187 |

PIEZOELECTRIC RESONATOR AND ELECTRONIC COMPONENT CONTAINING SAME

BACKGROUND OF THE INVENTION

1. Field of the Invention

The present invention relates to novel piezoelectric resonators and electronic components containing the novel piezoelectric resonators, and more particularly, to a piezoelectric resonator which maximizes the effective use of mechanical resonance of the novel piezoelectric member, and electronic components containing the piezoelectric resonator, such as an oscillator, a discriminator, and a filter.

2. Description of the Related Art

FIG. 34 is a perspective view of a conventional piezoelectric resonator. A piezoelectric resonator 1 includes a single piezoelectric substrate 2 having, for example, a rectangular plate shape as viewed from above. The single piezoelectric substrate 2 is polarized in a thickness direction of the substrate 2. On two opposite surfaces of the single piezoelectric substrate 2, electrodes 3 are disposed. When a signal is input between the electrodes 3, an electric field is applied to the single piezoelectric substrate 2 in the thickness direction and the single piezoelectric substrate 2 vibrates in the longitudinal direction.

In FIG. 35, there is shown a piezoelectric resonator 1 in which electrodes 3 are disposed on two surfaces of a single piezoelectric substrate 2 having a square plate shape as viewed from above. The single piezoelectric substrate 2 of the piezoelectric resonator 1 is polarized in the thickness direction. When a signal is input between the electrodes 3 in the piezoelectric resonator 1, an electric field is applied to the single piezoelectric substrate 2 in the thickness direction and the single piezoelectric substrate 2 vibrates in a square-type vibration mode (in the plane direction).

These piezoelectric resonators are unstiffened type resonators, in which the vibration direction differs from the direction of polarization and the electric field. The electromechanical coupling coefficient of such an unstiffened piezoelectric resonator is lower than that of a stiffened piezoelectric resonator. In stiffened piezoelectric resonators, the vibration direction, the direction of polarization, and the direction in which an electric field is applied are the same. An unstiffened piezoelectric resonator has a relatively small frequency difference ΔF between the resonant frequency and the antiresonant frequency. This leads to a drawback in which a frequency-band width is too narrow when an unstiffened resonator is used as an oscillator or a filter. Therefore, the degree of freedom and flexibility in resonator characteristics design is limited in such an unstiffened piezoelectric resonator and electronic components using such piezoelectric resonators.

The piezoelectric resonator shown in FIG. 34 uses the first-order resonance in the longitudinal mode. It also generates, because of its structure, large spurious resonances in odd-number-order harmonic modes, such as the third-order and fifth-order modes, and in the width mode. To suppress these spurious resonances, some solutions have been considered, such as polishing, increasing mass, and changing the shape of the electrodes. These solutions increase manufacturing cost.

In addition, since the piezoelectric substrate has a rectangular plate shape, the thickness of the substrate cannot be reduced because of restrictions in strength. Therefore, the distance between the electrodes cannot be reduced and a capacitance between terminals cannot be increased. This makes it extremely difficult to achieve impedance matching with an external circuit. To form a ladder filter by alternately connecting a plurality of piezoelectric resonators in series and in parallel, the capacitance ratio of the series resonator to the parallel resonator needs to be made large in order to increase attenuation. Because a piezoelectric resonator has the structure and shape restrictions described above, however, large attenuation cannot be obtained.

The piezoelectric resonator shown in FIG. 35 uses square-type first-order resonance (in the plane direction). As a result of its structure, large spurious resonances such as those in the thickness mode and in the triple-wave mode in the plane direction are also generated. Since the piezoelectric resonator requires a large size as compared with a piezoelectric resonator using the longitudinal vibration in order to obtain the same resonant frequency, it is difficult to reduce the size of piezoelectric resonator. When a ladder filter is formed by a plurality of piezoelectric resonators, in order to increase the capacitance ratio between the series resonator and the parallel resonator, the resonators connected in series have a substantially increased thickness and electrodes are formed only on part of a piezoelectric substrate which reduces the capacitance. In this case, since the electrodes are formed only partially, the difference ΔF between the resonant frequency and the antiresonant frequency as well as the capacitance is reduced. The resonators connected in parallel are accordingly required to have small ΔF. As a result, the piezoelectricity of the piezoelectric substrate is not effectively used, and the transmission band width of the filter cannot be increased.

The inventors desired to provide a piezoelectric resonator having small spurious resonance and a large difference ΔF between the resonant frequency and the antiresonant frequency. In such a piezoelectric resonator, a plurality of piezoelectric layers and a plurality of electrodes are alternately laminated to form a base member, and the plurality of piezoelectric layers are polarized in the longitudinal direction of the base member. This laminated piezoelectric resonator is a stiffened resonator type, and includes piezoelectric layers in which the vibration direction, the direction of polarization, and the direction in which an electric field is applied are the same. Therefore, as compared with an unstiffened piezoelectric resonator, in which the vibration direction differs from the direction of polarization and electric field, the stiffened piezoelectric resonator has a larger electromechanical coupling coefficient and a larger frequency difference ΔF between the resonant frequency and the antiresonant frequency. In addition, vibrations in modes such as the width and thickness modes, which are different from the basic vibration, are unlikely to occur in a stiffened piezoelectric resonator.

Since in the piezoelectric resonator having this lamination-structure, each piezoelectric layer constituting the base member has the same length in the longitudinal direction of the base member as the other piezoelectric layers and each electrode has the same area as the other electrodes, the capacitance between each pair of adjacent electrodes is the same and the driving force piezoelectrically generated by each piezoelectric layer is also the same.

In the longitudinal basic vibration, a stronger driving force is required at a portion of the base member located closer to the center thereof because of the large mass of this portion as compared to an end portion of the base member. Therefore, the piezoelectric resonator has an insufficiently large electromechanical coupling coefficient and thus ΔF is not sufficiently large.

In such piezoelectric resonator, high-order-mode vibration is unlikely to occur. Since the capacitance between each pair of adjacent electrodes is constant because each piezoelectric layer has the same length in the longitudinal direction of the base member and each electrode has the same surface area, however, charges generated in each piezoelectric layer by odd-number-high-order-mode vibration, such as the third-order and fifth-order vibrations, are not sufficiently canceled, causing high-order-mode spurious vibrations.

SUMMARY OF THE INVENTION

To solve the problems described above, the preferred embodiments of the present invention provide a piezoelectric resonator having a small spurious resonance, a large difference $\Delta F$ between the resonant frequency and the antiresonant frequency, and an easily adjustable $\Delta F$, and an electronic component containing the piezoelectric resonator.

The preferred embodiments of the present invention also provide a piezoelectric resonator having an even smaller spurious resonance and an even larger difference $\Delta F$ between the resonant frequency and the antiresonant frequency, and provide an electronic component containing the piezoelectric resonator.

The advantages of the preferred embodiments described herein are achieved by providing a difference in capacitance between piezoelectric layers of a resonator including a base member made up of a laminated stack of a plurality of piezoelectric layers. This desired difference in capacitance can be achieved by at least two different structural arrangements. One involves providing electrodes having varying surface area on the piezoelectric layers. Another arrangement achieves the difference in capacitance by providing different intervals or distances between electrodes which is achieved by providing layers having different thicknesses.

According to the preferred embodiments of the present invention, a piezoelectric resonator includes a base member including an integral unit containing a plurality of laminated piezoelectric layers and a plurality of electrodes disposed in the base member and spaced at intervals in the longitudinal direction of the base member, the plurality of electrodes being disposed on surfaces of the plurality of piezoelectric layers and spaced at intervals along the base member; wherein a first capacitance between a first pair of the plurality of electrodes is different from a second capacitance between a second pair of the plurality of electrodes.

According to a specific preferred embodiment of the present invention, a piezoelectric resonator includes a base member, the base member including a plurality of laminated piezoelectric layers; and a plurality of electrodes disposed substantially perpendicularly to a longitudinal direction of the base member at intervals in the longitudinal direction of the base member, the plurality of electrodes being formed on surfaces of the plurality of piezoelectric layers which surfaces are substantially perpendicular to the longitudinal direction of the base member; wherein the plurality of piezoelectric layers are polarized in the longitudinal direction of the base member, and at least one pair of opposing electrodes among the plurality of electrodes has a surface area different in size from a surface area of other pairs of opposing electrodes.

In a piezoelectric resonator according to the preferred embodiments of the present invention, it is preferred that the common area of opposing electrodes among the plurality of electrodes be larger for the opposing electrodes which are located closer to the center of the base member in the longitudinal direction.

The piezoelectric resonator according to the preferred embodiments of the present invention may further include a support member, and a mounting member disposed between the support member and a center section of the base member in the longitudinal direction.

The advantages of the preferred embodiments of the present invention are achieved in another aspect through the provision of an electronic component using the above-described novel piezoelectric resonator, wherein the support member preferably comprises an insulating substrate on which a pattern electrode is disposed; the base member is mounted on the insulating substrate via a mounting member; and a cap is disposed on the insulating substrate so as to cover the base member.

The advantages of the preferred embodiments of the present invention are achieved in still another aspect through the provision of an electronic component containing the above-described novel piezoelectric resonator, wherein the support member comprises an insulating substrate on which a pattern electrode is formed; a plurality of the novel piezoelectric resonators mounted on the insulating substrate via mounting members so as to form a ladder filter; and a cap is disposed on the insulating substrate so as to cover the plurality of piezoelectric resonators.

The piezoelectric resonator according to the preferred embodiments of the present invention is a stiffened type resonator, and has piezoelectric layers in which the vibration direction, the direction of polarization, and the direction in which an electric field is applied are the same. Therefore, as compared with an unstiffened piezoelectric resonator, in which the vibration direction differs from the direction of polarization and electric field, the stiffened piezoelectric resonator has a larger electromechanical coupling coefficient and a larger frequency difference $\Delta F$ between the resonant frequency and the antiresonant frequency. In addition, vibrations in modes such as the width and thickness modes, which are different from longitudinal vibration, are unlikely to occur in the stiffened piezoelectric resonator.

Since in a piezoelectric resonator according to the preferred embodiments of the present invention, opposing electrodes among a plurality of electrodes have surface areas with different sizes, $\Delta F$ can be easily adjusted by changing the size of the electrode surface areas.

In a piezoelectric resonator according to the preferred embodiments of the present invention, when the area of opposing electrodes increases for electrodes located closer to the center of the base member in the longitudinal direction of the base member, a larger capacitance between electrodes and a stronger driving force generated by each piezoelectric layer are provided as compared with a lamination-structure piezoelectric resonator in which each piezoelectric layer has the same length in the longitudinal direction of the base member and each electrode disposed on each piezoelectric layer covers a whole area of a surface of the piezoelectric layer which surface is substantially perpendicular to the longitudinal direction of the base member. Since a strong driving force required for longitudinal basic vibration is obtained at the center of the base member in the longitudinal direction, the electromagnetic coupling coefficient becomes even larger, and thus $\Delta F$ also becomes even larger.

In a piezoelectric resonator according to the preferred embodiments of the present invention, when electrodes are formed such that an area of opposing electrodes becomes larger in the electrodes that are located closer to the center of the base member in the longitudinal direction, the piezoelectric resonator has a larger capacitance between the electrodes than a lamination-structure piezoelectric resonator having a uniform electrode surface for all of the opposing electrodes. Therefore, charges generated in each piezoelectric layer by odd-number-high-order-mode vibration, such as the third-order and fifth-order vibrations, are canceled, and high-order-mode spurious vibrations are suppressed.

When electronic components such as an oscillator, a discriminator, and a filter are made using a piezoelectric resonator according to the preferred embodiments of the present invention, the piezoelectric resonator is mounted on an insulating substrate on which pattern electrodes are disposed and is covered by a cap to form chip-type, surface-mountable electronic components.

According to the preferred embodiments of the present invention, a piezoelectric resonator having a small spurious resonance, a large difference $\Delta F$ between the resonant frequency and the antiresonant frequency, and adjustable $\Delta F$ is obtained.

According to the preferred embodiments of the present invention, the frequency difference $\Delta F$ between the resonant frequency and the antiresonant frequency can be made even larger as compared with a piezoelectric resonator having a uniform electrode surface for each of the opposing electrodes, and thus a wide-frequency-band piezoelectric resonator is obtained. In addition, vibrations in modes other than the basic-vibration mode are unlikely to occur in a piezoelectric resonator according to the preferred embodiments of the present invention, and superior characteristics are achieved.

Since a chip-type electronic component can be made using the piezoelectric resonator according to the preferred embodiments of the present invention, it is easy to mount the component on a circuit board.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

Figure 1:
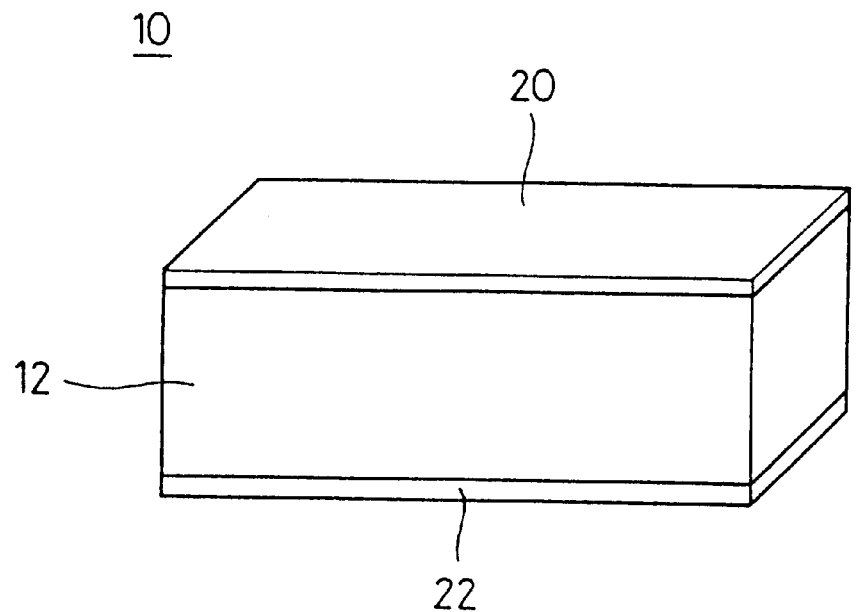
FIG. 1 is a perspective view of a piezoelectric resonator according to a preferred embodiment of the present invention.
Figure 2:
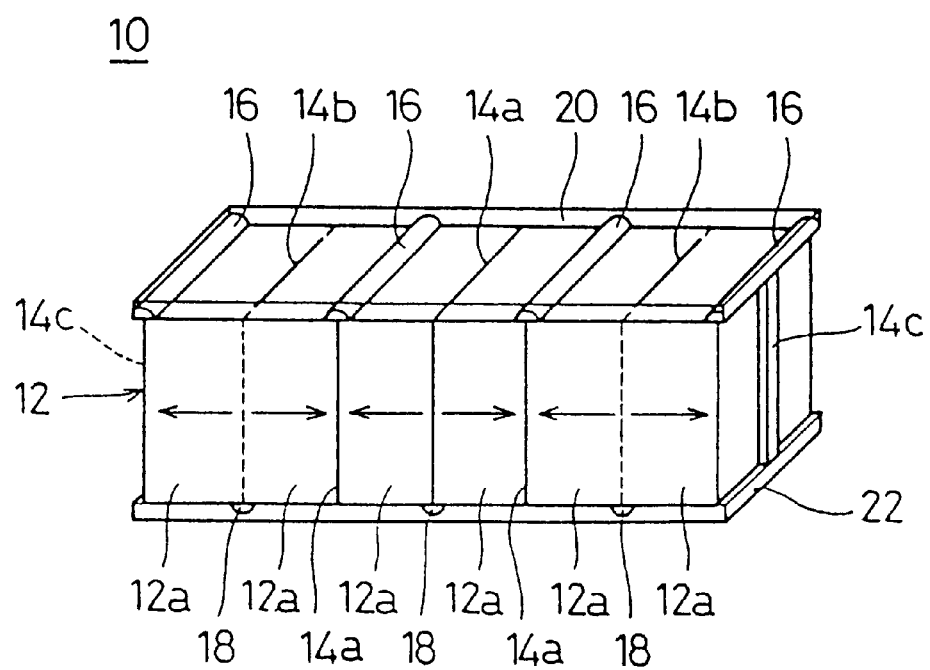
FIG. 2 is a view showing the structure of the piezoelectric resonator shown in FIG. 1.

FIG. 1 is a perspective view of a piezoelectric resonator according to a preferred embodiment of the present invention. FIG. 2 shows the internal structure of the piezoelectric resonator. In one example of the preferred embodiments of the present invention, a piezoelectric resonator 10 shown in FIGS. 1 and 2 preferably includes a substantially rectangular-parallelpiped-shaped base member 12 measuring, for example, approximately 3.8 mm by 1 mm by 1 mm. The base member 12 preferably includes six laminated piezoelectric layers 12a made from, for example, piezoelectric ceramic. Each of these piezoelectric layers 12a preferably has the same dimensions. The piezoelectric layers 12a are polarized such that adjacent layers have opposite directions of polarization as shown by arrows in FIG. 2.

On both main surfaces of the six piezoelectric layers 12a in the base member 12, which are preferably arranged to be substantially perpendicular to the longitudinal direction of the base member 12, seven electrodes 14a, 14b, and 14c are disposed. The electrodes 14a, 14b, and 14c are therefore disposed substantially perpendicularly to the longitudinal direction of the base member 12 and spaced at certain intervals in the longitudinal direction of the base member 12. The intervals between the electrodes 14a, 14b, and 14c are equal to the dimensions of the corresponding layers among the six piezoelectric layers 12a in the longitudinal direction of the base member 12, respectively.

As can be readily understood, any number of laminated piezoelectric layers and electrodes may be provided. Thus, the preferred embodiments of the present invention are not limited to the example having six piezoelectric layers 12a and seven electrodes.

Figure 3:
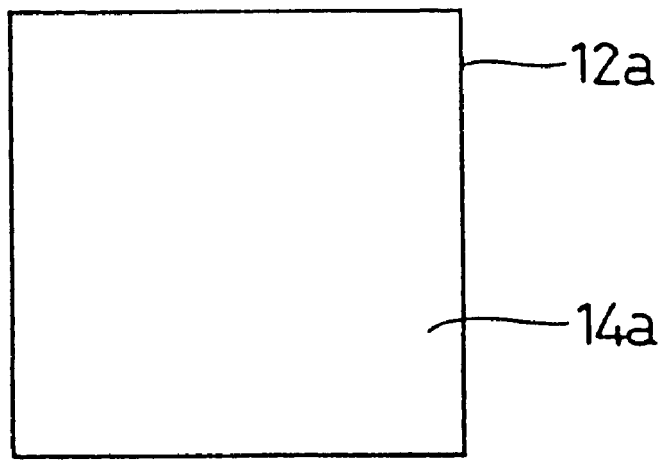
FIG. 3 is a plan of an electrode used in the piezoelectric resonator shown in FIG. 1.
Figure 4:
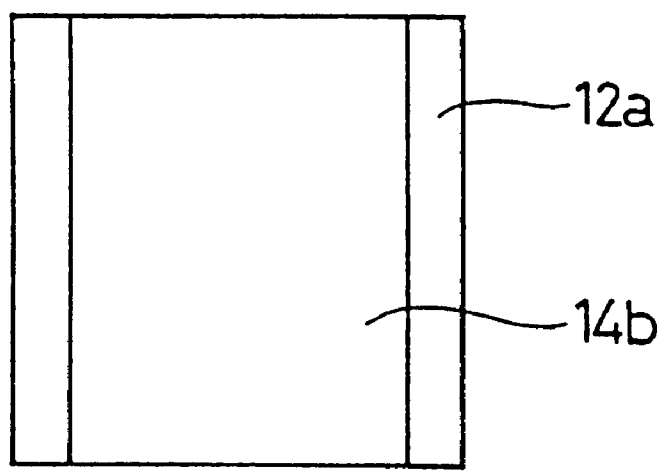
FIG. 4 is a plan of another electrode used in the piezoelectric resonator shown in FIG. 1.

One electrode 14a located substantially at the center of the base member 12 in the longitudinal direction and two electrodes 14a disposed closest thereto are preferably formed to cover entire areas of the main surfaces of the piezoelectric layers 12a as shown in FIG. 3. In other words, these electrodes 14a preferably having the same area (100%) as the main surface of the piezoelectric layer 12a. Two electrodes 14b disposed outside the three electrodes 14a are preferably formed at the center in the width direction on the main surfaces of the piezoelectric layers 12a as shown in FIG. 4. The two electrodes 14b preferably cover about 95% of the area of the main surface of the piezoelectric layer 12a. Two electrodes 14c disposed at an outermost portion of the base member 12 are preferably formed at the center in the width direction on the main surfaces of the piezoelectric layers 12a such that the electrodes are relatively smaller. The electrodes preferably occupy about 5% of the area of the main surface of the piezoelectric layer 12a. Therefore, in the longitudinal direction of the base member 12, the common (overlapping) area of opposing electrodes, the first electrode 14a located substantially at the center and the second electrode 14a, preferably covers about 100% of the area of the main surface of the piezoelectric layer 12a, the common or overlapping area of opposing electrodes, the second electrode 14a and the third electrode 14b preferably covers about 95% of the main surface, and the common or overlapping area of the third electrode 14b and the fourth electrode 14c, which are the outermost electrodes, preferably covers about 5% of the area. The electrodes 14a, 14b, and 14c are formed such that the common or overlapping area of two adjacent (opposing) electrodes increases in the electrodes located closer to the center of the base member 12 in the longitudinal direction.

In FIGS. 2 and 4, the electrodes 14b are drawn exaggeratedly small and the electrodes 14c are drawn exaggeratedly large.

Figure 5A:
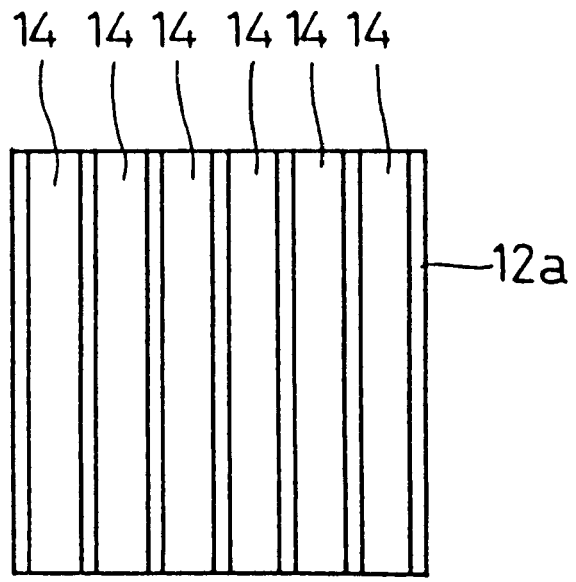
FIG. 5A is a plan of a modified electrode.
Figure 5B:
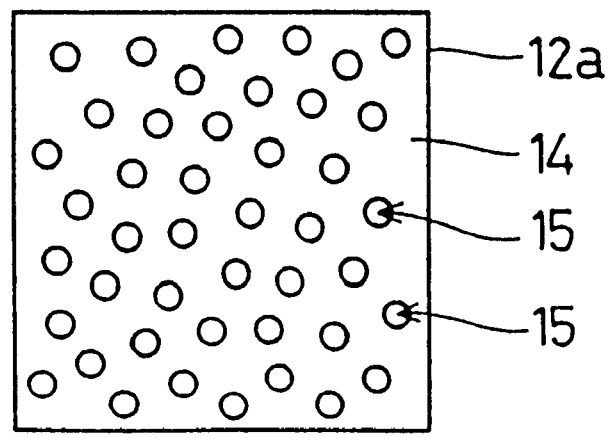
FIG. 5B is a plan of another modified electrode.

To adjust the common area of opposing electrodes, electrodes 14 may be formed as stripes on the main surface of the piezoelectric layer 12a as shown in FIG. 5A. Electrodes 14 may also be formed on the main surfaces of the piezoelectric layers 12a with holes 15 being made in the electrodes 14 as shown in FIG. 5B On opposing side surfaces of the base member 12, a plurality of insulating films 16 and 18 are disposed, respectively. On one side surface of the base member 12, the insulating film 16 covers the exposed end sections of alternate electrodes 14a, 14b, and 14c. On the other side surface of the base member 12, the insulating film 18 covers the exposed end sections of alternate electrodes 14a, 14b, and 14c not covered by the insulating film 16 on the above-described side surface. The two side surfaces of the base member 12 on which the insulating films 16 and 18 are provided serve as connection sections to external electrodes, which will be described later.

In these connection sections, namely, the side surfaces of the base member 12 on which the insulating films 16 and 18 are disposed, external electrodes 20 and 22 are provided. The electrode 20 connects to electrodes 14a, 14b, and 14c which are not covered by the insulating film 16, and the electrode 22 connects to electrodes 14a, 14b, and 14c which are not covered by the insulating film 18. In other words, two adjacent electrodes among the electrodes 14a, 14b, and 14c are connected to the electrodes 20 and 22, respectively.

The piezoelectric resonator 10 uses the external electrodes 20 and 22 as input and output electrodes. The piezoelectric layers 12a of the base member 12 are preferably piezoelectrically active because an electric field is applied between adjacent electrodes among the electrodes 14a, 14b, and 14c by applying a signal to the external electrodes 20 and 22. Since voltages are applied in opposite directions to the piezoelectric layers 12a which are polarized in opposite directions in the base member 12, the piezoelectric layers 12a expand and contract as an entire integral unit in the same direction. Therefore, the entire piezoelectric resonator 10 as a whole vibrates in the longitudinal direction in basic mode with a node being defined substantially at the center of the base member 12.

In the piezoelectric resonator 10, the polarization direction of the piezoelectric layer 12a, the applied electric field direction resulting from an input signal, and the direction of vibration in the piezoelectric layer 12a are all the same. In other words, the piezoelectric resonator 10 is a stiffened type resonator. The piezoelectric resonator 10 has a larger electromagnetic coupling coefficient than an unstiffened piezoelectric resonator, in which the direction of vibration differs from the direction of polarization and electric field. Therefore, the piezoelectric resonator 10 has a larger frequency difference ΔF between the resonant frequency and the antiresonant frequency than the conventional unstiffened piezoelectric resonator. As a result, the piezoelectric resonator 10 achieves wide-frequency-band characteristics as compared with the conventional unstiffened piezoelectric resonator.

Figure 6:
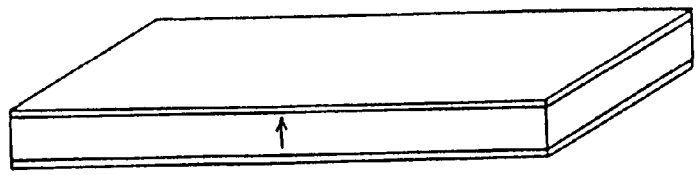
FIG. 6 is a perspective view of an unstiffened piezoelectric resonator which vibrates in the longitudinal direction, shown for comparison.
Figure 7:
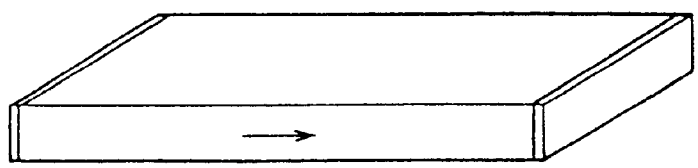
FIG. 7 is a perspective view of a stiffened piezoelectric resonator which vibrates in the longitudinal direction.
Figure 8:
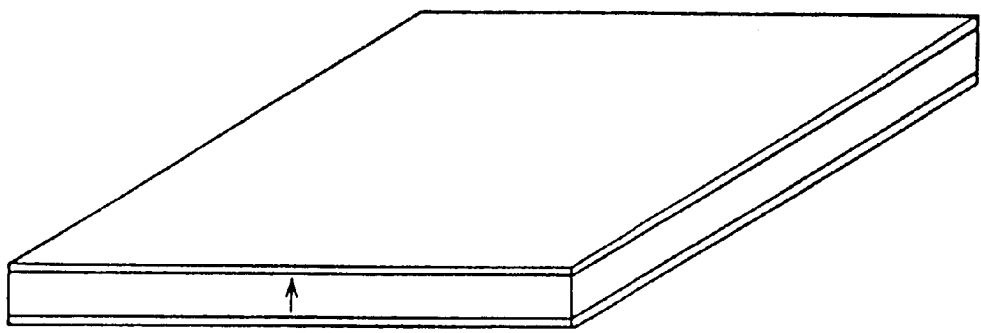
FIG. 8 is a perspective view of an unstiffened piezoelectric resonator which vibrates in the plane direction (square-type vibration), shown for comparison.

To measure differences between stiffened and unstiffened piezoelectric resonators, piezoelectric resonators shown in FIGS. 6, 7, and 8 were made. The piezoelectric resonator shown in FIG. 6 was made by forming electrodes on both surfaces in the thickness direction of a piezoelectric substrate measuring approximately 4.0 mm by 1.0 mm by 0.38 mm. This piezoelectric resonator was polarized in the thickness direction and vibrated in the longitudinal direction when a signal was applied to the electrodes. The piezoelectric resonator shown in FIG. 7 had the same dimensions as the piezoelectric resonator shown in FIG. 6. Electrodes were formed on both surfaces in the longitudinal direction of a piezoelectric substrate. The piezoelectric resonator was polarized in the longitudinal direction and vibrated in the longitudinal direction when a signal was applied to the electrodes. The piezoelectric resonator shown in FIG. 8 was made by forming electrodes on both surfaces in the thickness direction of a piezoelectric substrate measuring approximately 4.7 mm by 4.7 mm by 0.38 mm. This piezoelectric resonator was polarized in the thickness direction and vibrated in the plane direction when a signal was applied to the electrodes. The piezoelectric resonators shown in FIGS. 6 and 8 were unstiffened type resonators and the piezoelectric resonator shown in FIG. 7 was of a stiffened type resonator.

The resonant frequency Fr and the electromechanical coupling coefficient K of each of these piezoelectric resonators were measured and the results are shown in Tables 1, 2, and 3. Table 1 indicates the measured results of the piezoelectric resonator shown in FIG. 6. Table 2 indicates the measured results of the piezoelectric resonator shown in FIG. 7. Table 3 indicates the measured results of the piezoelectric resonator shown in FIG. 8.

TABLE 1

|  | Basic longitudinal vibration | longitudinal triple-wave vibration | Width-mode vibration |
|---|---|---|---|
| Resonant frequency (MHz) | 0.460 | 1.32 | 1.95 |
| Electro-mechanical coupling coefficient (%) | 18.9 | 3.9 | 25.2 |

TABLE 2

|  | Basic longitudinal vibration | longitudinal triple-wave vibration | Width-mode vibration |
|---|---|---|---|
| Resonant frequency (MHz) | 0.455 | 1.44 | 1.96 |
| Electro-mechanical coupling coefficient (%) | 42.9 | 12.2 | 4.0 |

TABLE 3

|  | Basic longitudinal vibration | Square-type triple-wave vibration | Thickness-mode vibration |
|---|---|---|---|
| Resonant frequency (MHz) | 0.458 | 1.25 | 5.65 |
| Electro-mechanical coupling coefficient (%) | 35.0 | 11.5 | 23.3 |

It is understood from the measurement data that a stiffened piezoelectric resonator has a larger electromagnetic coupling coefficient K than an unstiffened piezoelectric resonator, and therefore has a larger frequency difference $\Delta F$ between the resonant frequency and the antiresonant frequency. The largest spurious vibration in a stiffened piezoelectric resonator is of longitudinal triple-wave type and the electromagnetic coupling coefficient K is 12.2% during vibration. During width-mode vibration, which is different from basic vibration, the electromagnetic coupling coefficient K is 4.0%. In contrast, the electromagnetic coupling coefficient K during width-mode vibration is 25.2% in an unstiffened longitudinal-vibration piezoelectric resonator. In an unstiffened square-type vibration piezoelectric resonator, the electromagnetic coupling coefficient K is as large as 23.3% during thickness-mode vibration. Therefore, it is understood that a stiffened piezoelectric resonator has smaller spurious vibrations than an unstiffened piezoelectric resonator.

Since the piezoelectric resonator 10 has a plurality of electrodes 14a, 14b, 14c in which opposing areas of the electrodes define the common or overlapping areas having different sizes, $\Delta F$ can be adjusted by changing the sizes of the overlapping or common areas.

In the piezoelectric resonator 10, since the size of the common or overlapping area of opposing electrodes increases in size as the electrodes 14a, 14b, and 14c in the opposing electrodes are located closer to the center of the base member 12 in the longitudinal direction, larger capacitances between electrodes 14a, 14b, and 14c and a stronger driving force generated by the piezoelectric layers 12a are provided as compared with a lamination-structure piezoelectric resonator having a uniform electrode surface area for all opposing electrodes. Since a strong driving force required for longitudinal basic vibration is achieved at the center of the base member 12 in the longitudinal direction of the preferred embodiments of the present invention, the electromagnetic coupling coefficient becomes even larger, and thus $\Delta F$ becomes even larger, as compared with a lamination-structure piezoelectric resonator having a uniform electrode surface area and resulting uniform common or overlapping area for each of the opposing electrodes.

Figure 9:
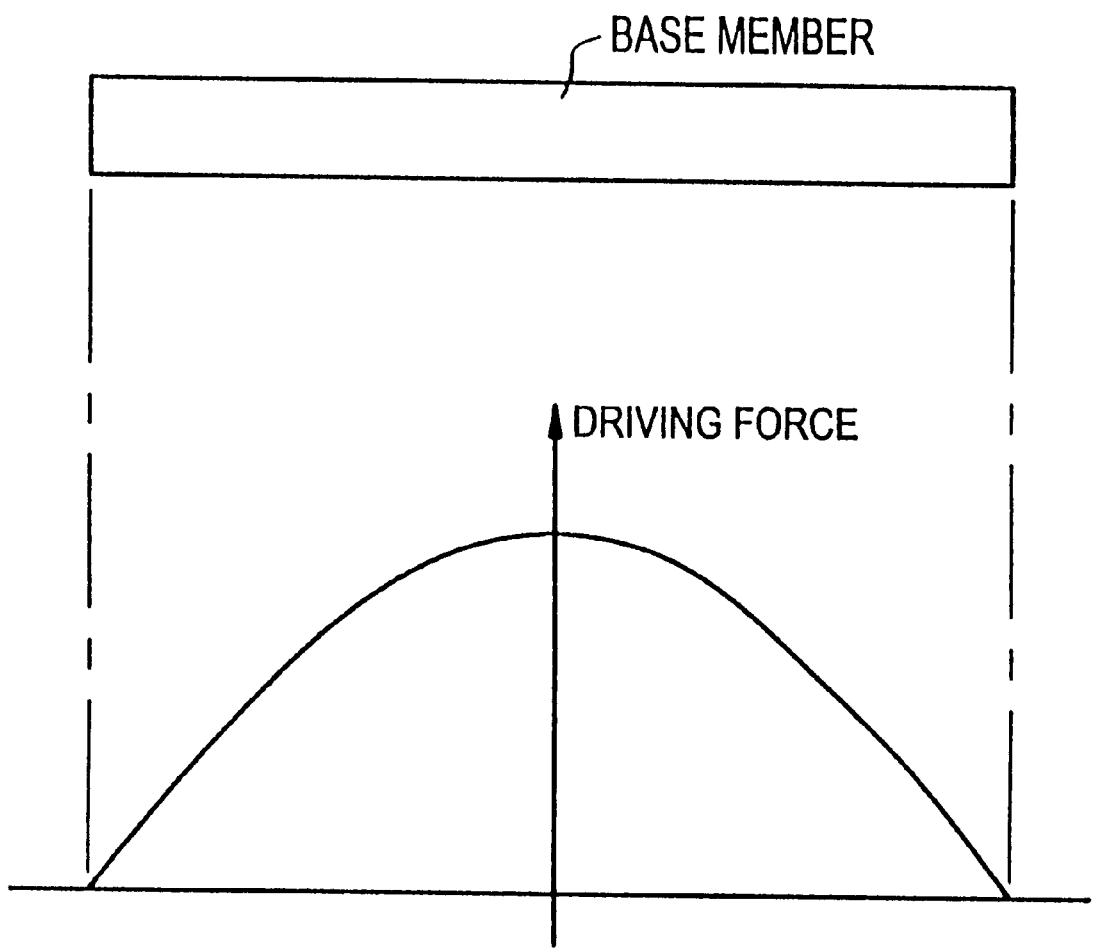
FIG. 9 is a view indicating ideal driving force required for the base member during longitudinal basic vibration.

In longitudinal basic vibration, a stronger driving force is required at a portion located closer to the center of the base member in the longitudinal direction because of the large mass of this portion extending to an end of the base member in the longitudinal direction. Ideally, as shown in FIG. 9, a driving force having a difference in strength corresponding to a cosine curve having the length of the base member as half the wavelength and a maximum amplitude at the center in the longitudinal direction of the base member is required. In contrast, in the piezoelectric resonator 10, since the size of the common or overlapping area of opposing ones of electrodes 14a, 14b, and 14c increases as the opposing electrodes are located closer to the center of the base member 12 in the longitudinal direction, a driving force which is different in strength and is well suited to longitudinal basic vibration, is obtained in the entire area extending in the longitudinal direction of the base member 12. Therefore, the electromagnetic coupling coefficient and $\Delta F$ become larger.

Figure 10:
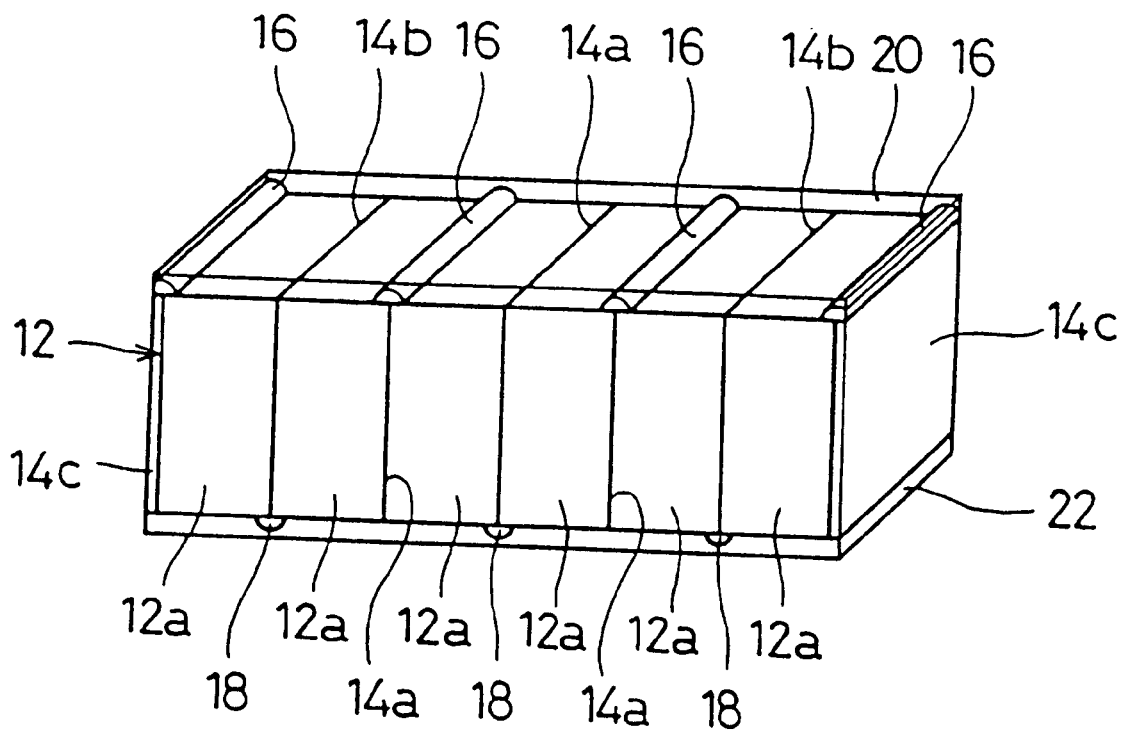
FIG. 10 is a view showing a lamination-structure piezoelectric resonator having a uniform electrode surface for each of the opposing electrodes.

To measure differences in $\Delta F$ and other factors caused by differences in intervals between a plurality of electrodes, a lamination-structure piezoelectric resonator shown in FIG. 10 was made. This piezoelectric resonator shown in FIG. 10 differed from the piezoelectric resonator 10 shown in FIGS. 1 and 2 in that seven electrodes 14a, 14b, and 14c were disposed to cover the entire main surfaces and arranged substantially perpendicular to the longitudinal direction of the base member 12 in the piezoelectric layers 12a. Therefore the lamination-structure piezoelectric resonator shown in FIG. 10 had a common or overlapping area of opposing ones of the electrodes 14a, 14b, and 14c, which was the same size as the area of the main surface of the piezoelectric layers 12a.

The resonant frequency Fr and the antiresonant frequency Fa were measured for the piezoelectric resonator 10 shown in FIGS. 1 and 2, and the piezoelectric resonator shown in FIG. 10. Table 4 indicates each resonant frequency Fr, each antiresonant frequency Fa, the frequency difference ΔF, and ΔF/Fa.

TABLE 4

|  | Piezoelectric Resonator (FIGS. 1 and 2) | Piezoelectric Resonator (FIG. 10) |
| --- | --- | --- |
| Resonant Frequency Fr (kHz) | 471.65 | 470.26 |
| Antiresonant Frequency Fa (kHz) | 535.48 | 531.14 |
| ΔF (kHz) | 63.83 | 60.88 |
| ΔF/Fa (%) | 11.92 | 11.46 |

It is clearly seen from the results indicated in Table 4 that the piezoelectric resonator 10 shown in FIGS. 1 and 2 has larger ΔF and larger ΔF/Fa than the piezoelectric resonator shown in FIG. 10.

Since the piezoelectric resonator 10 of the preferred embodiments of the present invention shown in FIGS. 1 and 2 has larger capacitances between the electrodes 14a, 14b, and 14c than the piezoelectric resonator shown in FIG. 10, and the capacitance between opposing electrodes as the electrodes are located closer to the center of the base member 12 in the longitudinal direction, charges generated in each piezoelectric layer 12a by odd-number-high-order-mode vibration, such as the third-order and fifth-order vibrations, are canceled, and high-order-mode spurious vibrations are suppressed.

Figure 11:
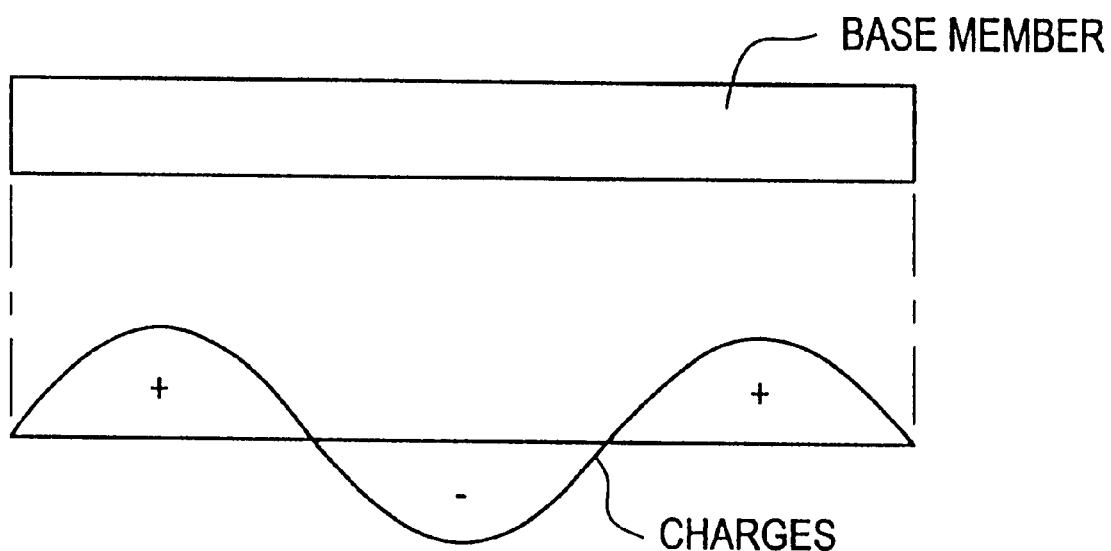
FIG. 11 is a view indicating charges generated by the third-order spurious vibration in the base member of the piezoelectric resonator shown in FIG. 10.
Figure 12:
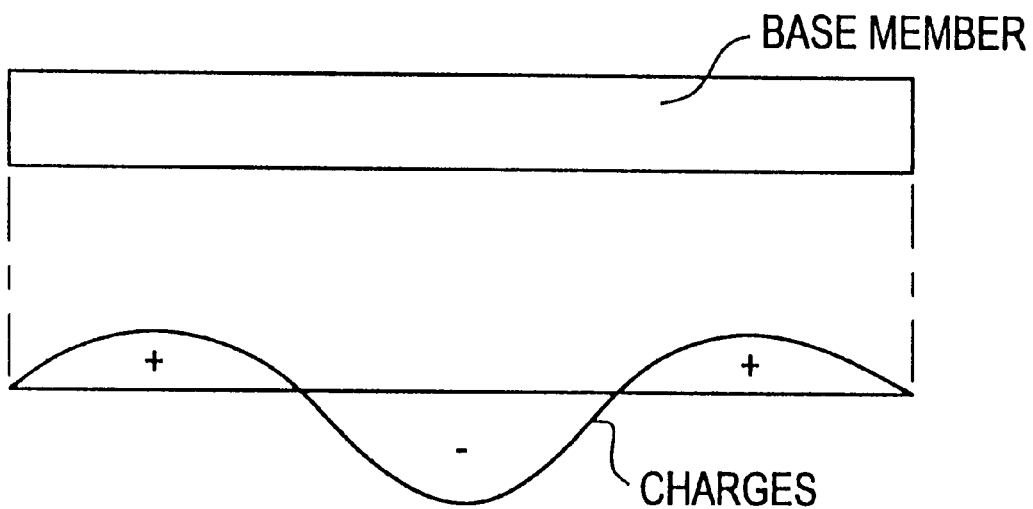
FIG. 12 is a view showing charges generated by the third-order spurious vibration in the base member of the piezoelectric resonator shown in FIGS. 1 and 2.

The third-order-mode spurious vibration is considered, for example. As shown in FIG. 11, charges having a cyclic amplitude and the same maximum amplitude are generated from one end to the other end in the longitudinal direction of the base member in the piezoelectric resonator shown in FIG. 10 and the charges are not sufficiently canceled and thus, remain. In contrast, in the piezoelectric resonator 10 of the preferred embodiments of the present invention shown in FIGS. 1 and 2, charges are generated such that they have a larger amplitude as they are generated closer to the center of the base member in the longitudinal direction as shown in FIG. 12, and most of the charges are canceled.

Figure 13:
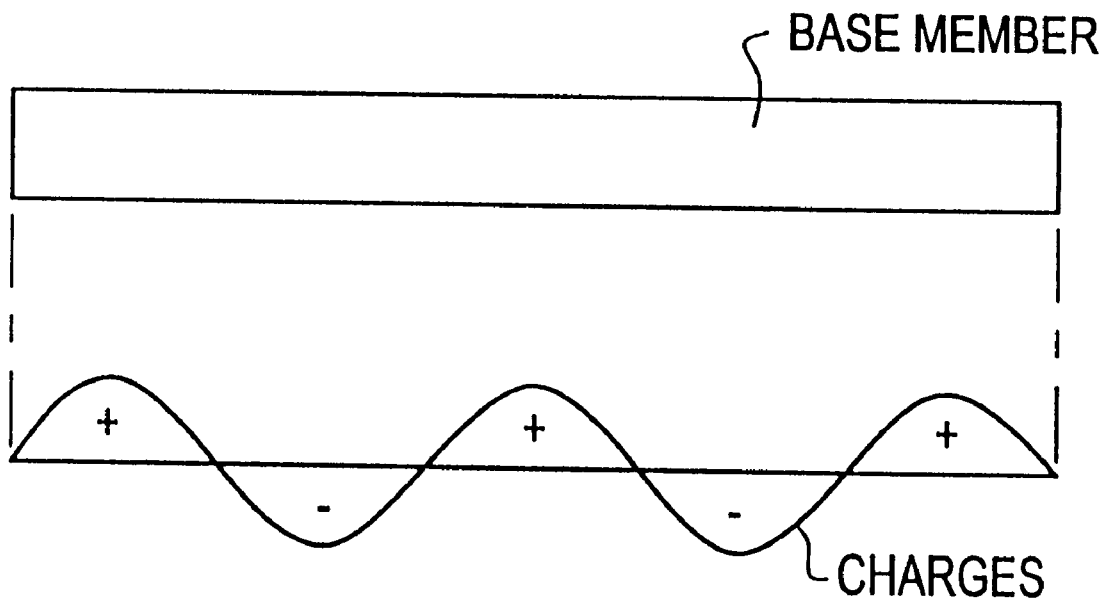
FIG. 13 is a view indicating charges generated by the fifth-order spurious vibration in the base member of the piezoelectric resonator shown in FIG. 10.
Figure 14:
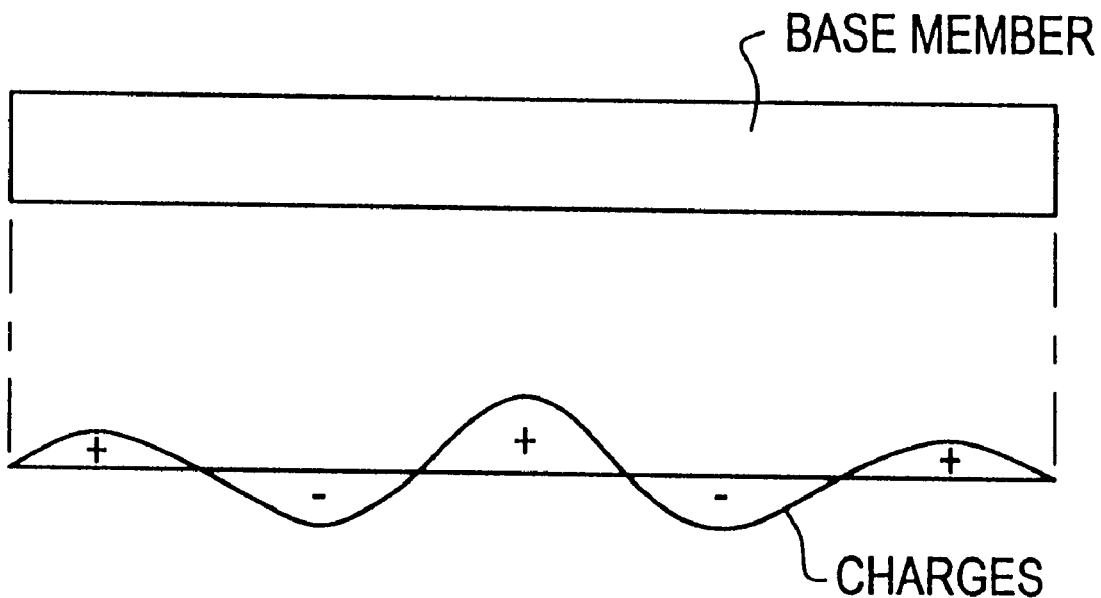
FIG. 14 is a view showing charges generated by the fifth-order spurious vibration in the base member of the piezoelectric resonator shown in FIGS. 1 and 2.

Next, the fifth-order-mode spurious vibration is examined. In the same way as in the third-order-mode spurious vibration, charges having a cyclic amplitude and the same maximum amplitude are generated as shown in FIG. 13 from one end to the other end in the longitudinal direction of the base member in the piezoelectric resonator shown in FIG. 10 and the charges are not sufficiently canceled and thus, remain. In contrast, in the piezoelectric resonator 10 of the preferred embodiments of the present invention shown in FIGS. 1 and 2, charges are generated such that they have a larger amplitude as they are generated closer to the center of the base member in the longitudinal direction as shown in FIG. 14, and most of the charges are canceled. In odd-number-order-mode spurious vibrations, such as the seventh-, ninth-, and eleventh-order vibrations, most charges are canceled as in the third- and fifth-order-mode spurious vibrations. Therefore, the piezoelectric resonator 10 of the preferred embodiments of the present invention shown in FIGS. 1 and 2 suppresses high-order-mode spurious vibrations more than the piezoelectric resonator shown in FIG. 10.

In the piezoelectric resonator 10 of the preferred embodiments of the present invention shown in FIGS. 1 and 2, the capacitance of the resonator can be easily adjusted by changing a size of the common or overlapping areas of opposing electrodes 14a, 14b, and 14c size, the number of the piezoelectric layers 12a, or the electrodes 14a, 14b, and 14c, or the dimensions of the piezoelectric layers 12a in the longitudinal direction of the base member 12. In other words, the capacitance can be increased by increasing the size of the common or overlapping areas of opposing electrodes 14a, 14b, and 14c, the number of the piezoelectric layers 12a, or the electrodes 14a, 14b, and 14c, or by decreasing the dimensions of the piezoelectric layers 12a in the longitudinal direction of the base member 12. In contrast, the capacitance can be easily reduced by reducing the size of the common areas of opposing electrodes 14a, 14b, and 14c, the number of the piezoelectric layers 12a, or the electrodes 14a, 14b, and 14c, or by increasing the dimensions of the piezoelectric layers 12a in the longitudinal direction of the base member 12. This means that a high degree of freedom and flexibility in capacitance design is achieved in the preferred embodiments of the present invention. Therefore, it is easy to achieve impedance matching with an external circuit when the piezoelectric resonator 10 is mounted on a circuit board.

Figure 15:
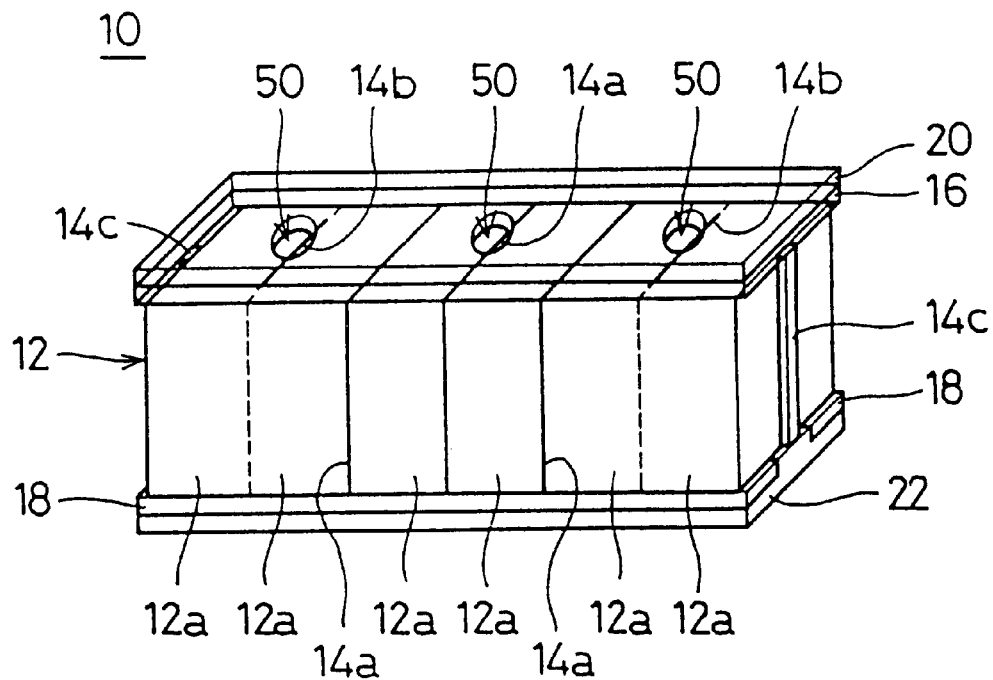
FIG. 15 is a view showing a modified example of the piezoelectric resonator shown in FIGS. 1 and 2.
Figure 16:
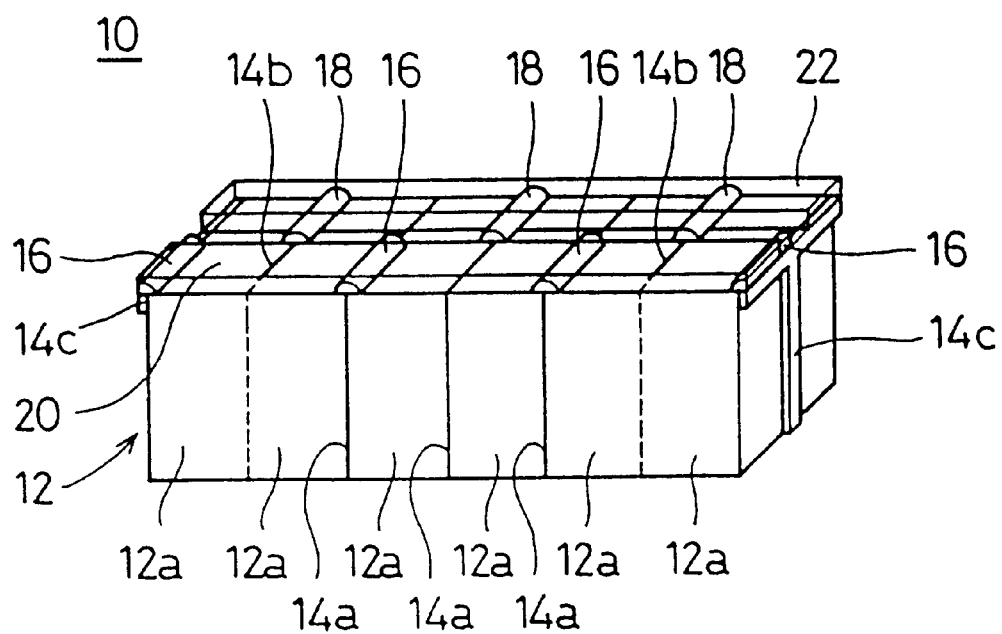
FIG. 16 is a view showing another modified example of the piezoelectric resonator shown in FIGS. 1 and 2.

In order to connect the electrodes 14a, 14b, and 14c to the external electrodes 20 and 22, insulating films 16 and 18 having openings 50 may be provided such that alternate electrodes 14a, 14b, and 14c are exposed as shown in FIG. 15. The external electrodes 20 and 22 are disposed on the insulating films 16 and 18, and the electrodes 14a, 14b, and 14c are alternately connected to the two external electrodes 20 and 22. Two external electrodes 20 and 22 may be provided on one side surface of the base member 12 as shown in FIG. 16. In this case, insulating films 16 and 18 are disposed on a single side surface of the base member 12 preferably in a two-row arrangement and two rows of connection sections are preferably provided. These two rows of insulating films 16 and 18 are disposed respectively on alternate electrodes 14a, 14b, and 14c. On these two rows of insulating films 16 and 18, two rows of external electrodes 20 and 22 are disposed, respectively. The outermost two electrodes 14c are formed, for example, in a T shape such that they connect to the external electrode 22. The piezoelectric resonators shown in FIGS. 15 and 16 achieve the same advantages as the piezoelectric resonator shown in FIGS. 1 and 2.

Figure 17:
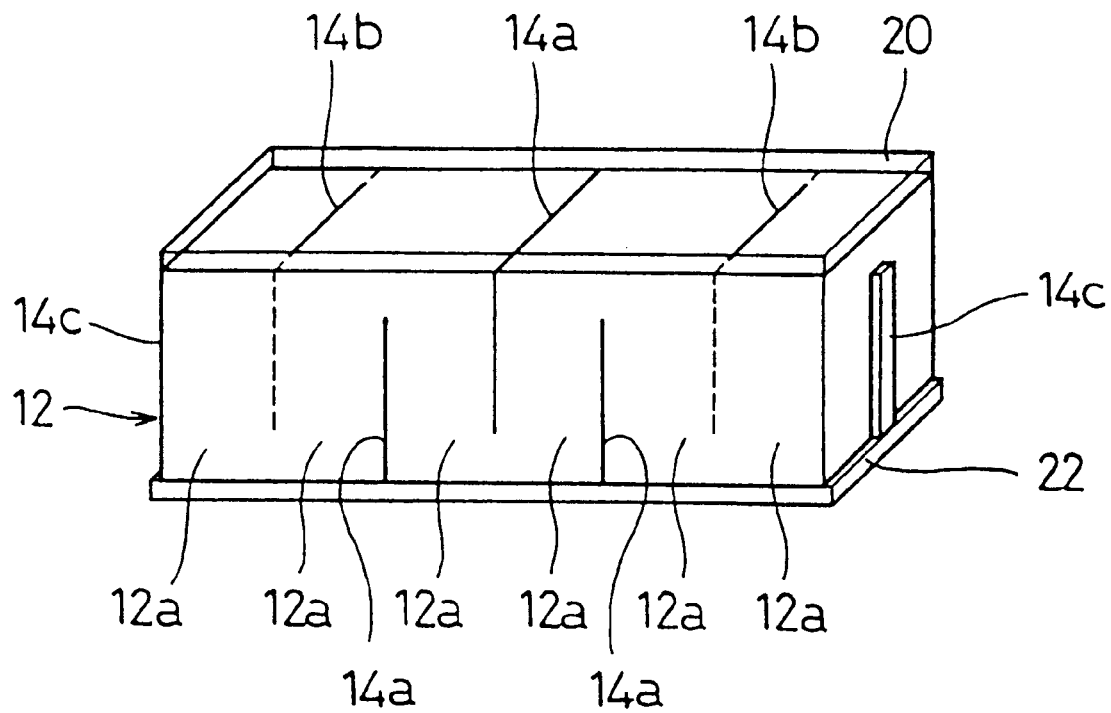
FIG. 17 is a view showing still another piezoelectric resonator according to the preferred embodiments of the present invention.

Internal electrodes 14a, 14b, and 14c may extend to the opposite side surfaces of the base member 12 alternately as shown in FIG. 17. On the opposite side surfaces of the base member 12, external electrodes 20 and 22 are preferably disposed. In the piezoelectric resonator 10 shown in FIG. 17, since the electrodes 14a, 14b, and 14c are exposed alternately, the internal electrodes 14a, 14b, and 14c are connected to the external electrodes 20 and 22 alternately by forming the external electrodes 20 and 22 on the side surfaces of the base member 12. Therefore, there is no need to form insulating films on the side surfaces of the base member 12. In this case, it is necessary to form the electrodes 14a, 14b, and 14c on the piezoelectric layers 12a with gaps provided such that the electrodes do not extend to one end of the piezoelectric layers 12a.

The electrodes 14a, 14b, or 14c are preferably not formed to cover the entire area of a cross section of the base member 12 in this piezoelectric resonator 10 shown in FIG. 17. Therefore, the size of the common or overlapping area of adjacent ones of the electrodes 14a, 14b, and 14c is smaller than an electrode formed to cover the entire cross section. By using such different sizes of common or overlapping areas, the capacitance and ΔF of the piezoelectric resonator 10 can be easily adjusted. As the common area of opposing electrodes 14a, 14b, and 14c becomes smaller, the capacitance and ΔF become smaller.

Figure 18:
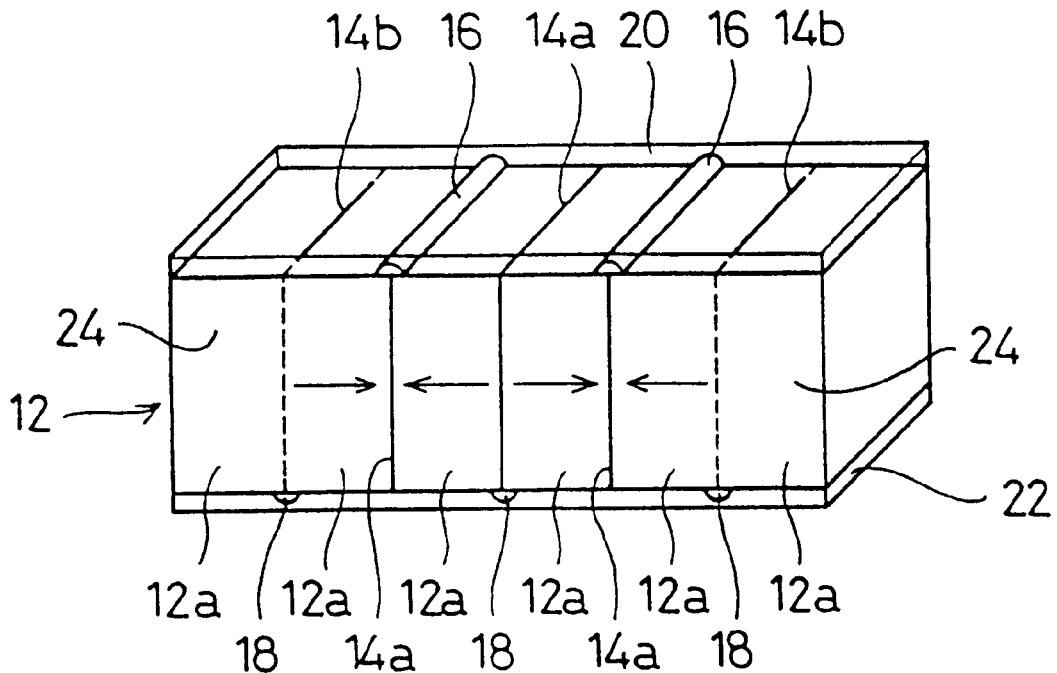
FIG. 18 is a view showing an inactive section.
Figure 19:
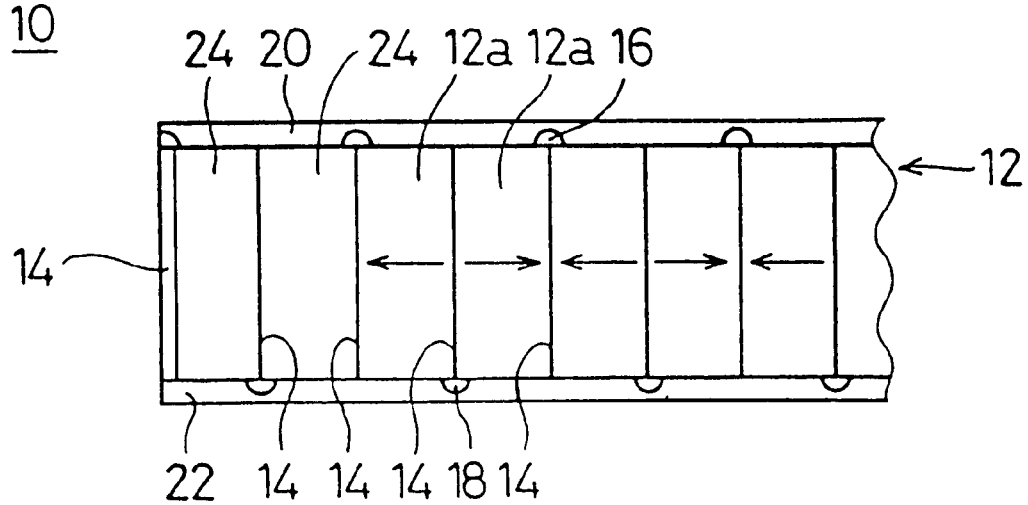
FIG. 19 is a view of a main portion including another inactive section.
Figure 20:
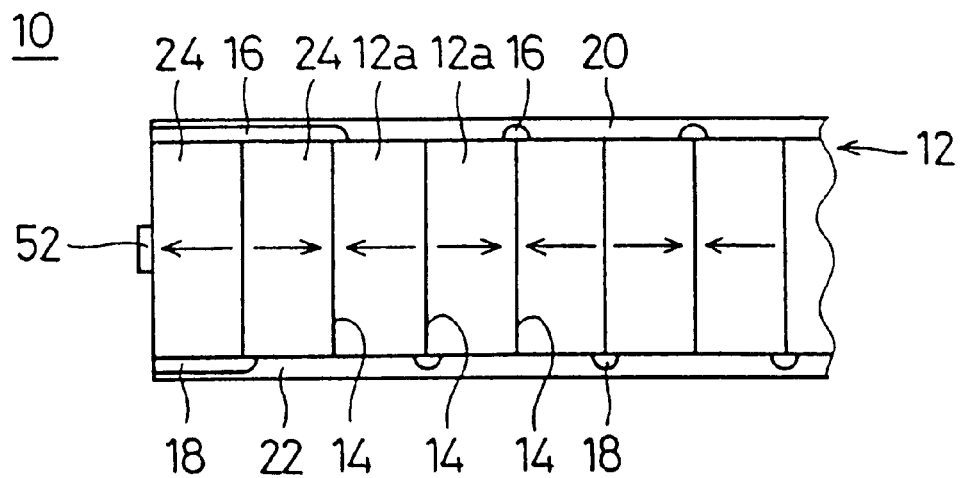
FIG. 20 is a view of a main portion including still another inactive section.

In the above-described piezoelectric resonator 10, the base member 12 is preferably piezoelectrically active from one end to the other end in the longitudinal direction and vibrates. A part of the base member 12 in the longitudinal direction may serve as an inactive section, which is piezoelectrically inactive. Such an inactive section 24 may be formed such that an electric field is not applied by not providing electrodes 14 at the ends of the base member 12 as shown in FIG. 18. If the inactive section is formed in that way, a process for forming electrodes at both ends of the base member 12 becomes unnecessary. The ends of the base member 12 may be polarized or may not be polarized. As shown in FIG. 19, only the ends of the base member 12 may be not polarized. In this case, even if an electric field is applied between the electrodes 14, a portion not polarized is piezoelectrically inactive. The structure may be formed such that an electric field is not applied to the piezoelectric layer serving as the inactive section 24 because the section is insulated by the insulating films 16 and 18 even if the section is polarized, as shown in FIG. 20. In other words, only when a piezoelectric layer is polarized and an electric field is applied, does the layer become piezoelectrically active, otherwise it is inactive. In this configuration, a capacitor is preferably provided in the inactive section, such that the capacitance is increased. A small electrode 52 may be formed on an end surface of the base member 12 as shown in FIG. 20 in order to adjust the frequency or to connect to an external circuit.

Figure 21:
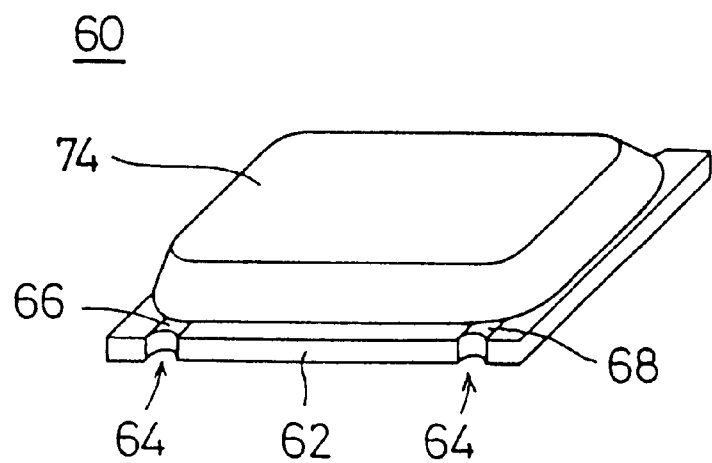
FIG. 21 is a perspective view of an electronic component using a piezoelectric resonator according to the preferred embodiments of the present invention.
Figure 22:
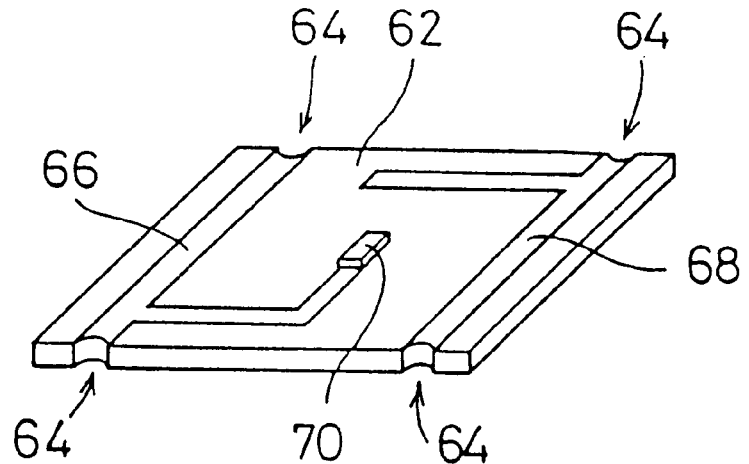
FIG. 22 is a perspective view of an insulating substrate used in the electronic component shown in FIG. 21

Using such a piezoelectric resonator 10, electronic components such as oscillators and discriminators are produced. FIG. 21 is a perspective view of an electronic component 60 according to a preferred embodiment of the present invention. The electronic component 60 includes an insulating substrate 62 serving as a support member. At opposing end portions of the insulating substrate 62, two indentations 64 are preferably formed, respectively. On one surface of the insulating substrate 62, two pattern electrodes 66 and 68 are provided as shown in FIG. 22. One pattern electrode 66 is arranged between opposing indentations 64 and extends in an L-shaped manner from a point near one end toward the center of the insulating substrate 62. The other pattern electrode 68 is arranged between opposing indentations 64 and extends substantially straight from a point near the other end toward the center of the insulating substrate 62. The pattern electrodes 66 and 68 are preferably routed in a roundabout fashion from the ends of the insulating substrate 62 to the opposite surface.

Figure 23:
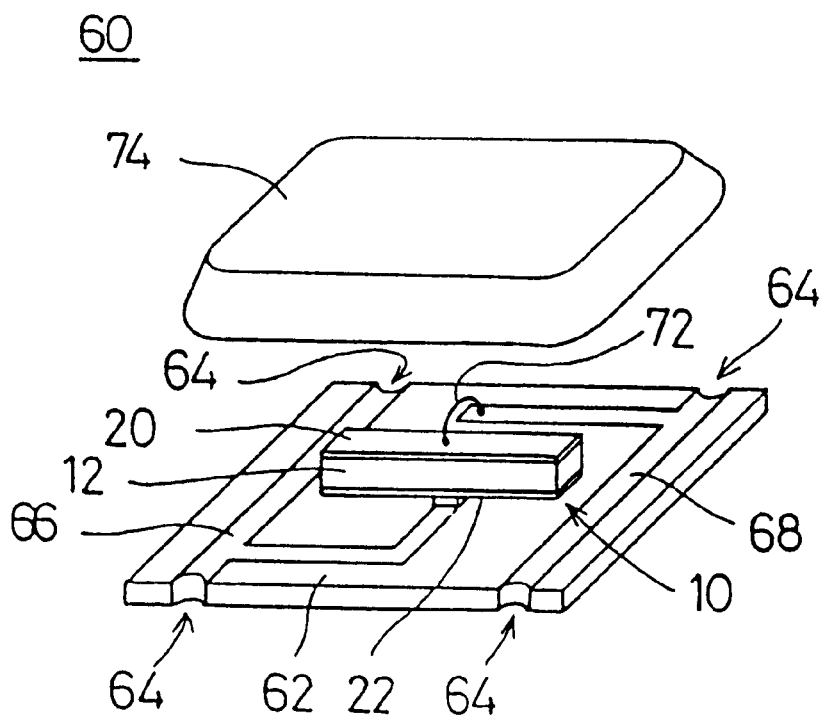
FIG. 23 is an exploded perspective view of the electronic component shown in FIG. 21.

At one end of the pattern electrode 66 preferably disposed substantially at the center of the insulating substrate 62, a protrusion 70 serving as a mounting member is formed with electrically conductive adhesive. As shown in FIG. 23, the above-described piezoelectric resonator 10 is preferably mounted on the protrusion 70 such that the center of the base member 12 is disposed on the protrusion 70. An external electrode 22 of the piezoelectric resonator 10 is, for example, connected to the protrusion 70. The other external electrode 20 is connected to a pattern electrode 68 preferably with electrically conductive wire 72. The electrically conductive wire 72 is preferably connected to substantially the center of the external electrode 20 of the piezoelectric resonator 10.

A metal cap 74 is placed on the insulating substrate 62 to complete the electronic component 60. To prevent the metal cap 74 from being short-circuited to the pattern electrodes 66 and 68, insulating resin or other suitable material is preferably applied to the insulating substrate 62 and the pattern electrodes 66 and 68 in advance. The electronic component 60 uses the pattern electrodes 66 and 68, which are arranged such that they are routed to the rear surface from ends of the insulating substrate 62, as input and output terminals for connecting to external circuits.

Since the center of the piezoelectric resonator 10 is preferably secured to the protrusion 70 in this electronic component 60, the ends of the piezoelectric resonator 10 are disposed separately from the insulating substrate 62 so vibration is not prevented or damped. Excited longitudinal vibration is not weakened because the center of the piezoelectric resonator, which serves as a node, is secured to the protrusion 70 and is connected to the electrically conductive wire 72.

The electronic component 60 is preferably mounted on a circuit board together with IC chips and other components to form an oscillator or a discriminator. Since the electronic component 60 is sealed and protected by the metal cap 74, it can be used as a chip-type, surface-mountable component which can be mounted by reflow soldering or other suitable method.

When the electronic component 60 is used in an oscillator, spurious vibrations are suppressed to a low level and unusual vibrations caused by the spurious vibrations are prevented as a result of the features of the novel piezoelectric resonator 10 used in the electronic component 60. It is also easy to achieve impedance matching with an external circuit since the capacitance of the piezoelectric resonator 10 can easily be set to any desired value. Especially when the electronic component is used for an oscillator for voltage-controlled oscillation, a wide frequency range which cannot be obtained conventionally is achieved due to a large ΔF of the resonator.

When the electronic component 60 is used for a discriminator, a wide peak-separation range is provided as a result of a large ΔF of the resonator. In addition, since the resonator provides a wide capacitance range, it is easy to achieve impedance matching with an external circuit.

Figure 24:
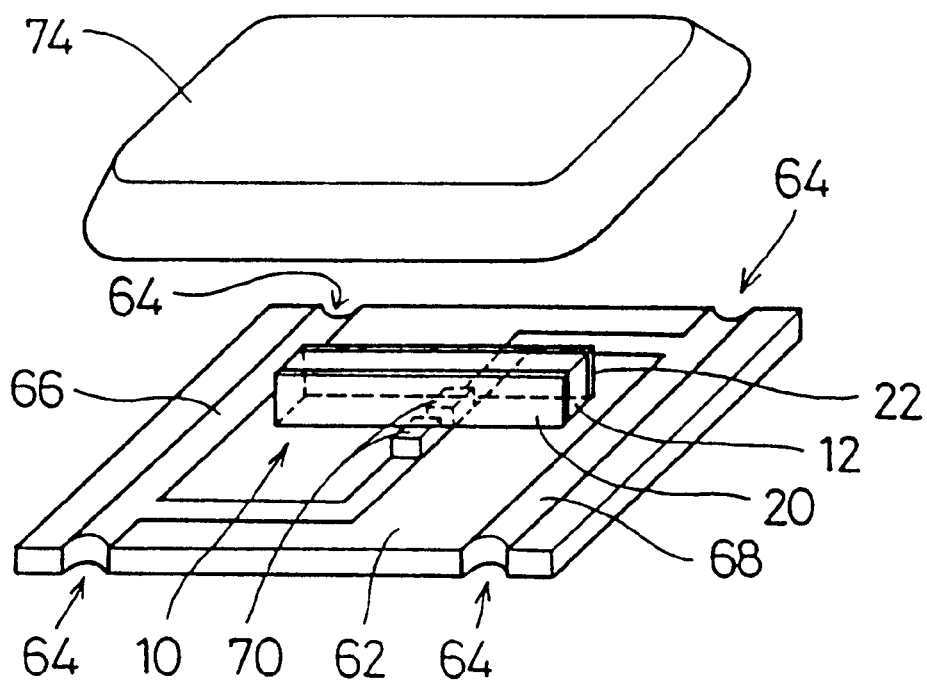
FIG. 24 is a view indicating another method for mounting the piezoelectric resonator on the insulating substrate.
Figure 25:
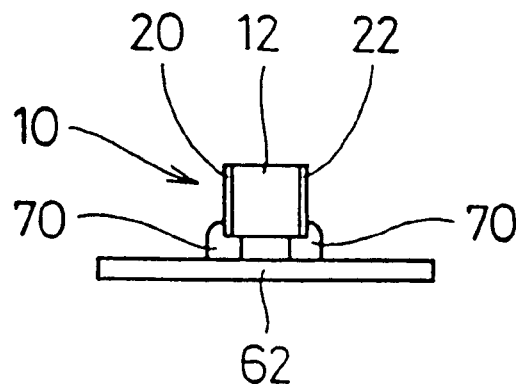
FIG. 25 is a side view showing the method for mounting the piezoelectric resonator, shown in FIG. 24.
Figure 26:
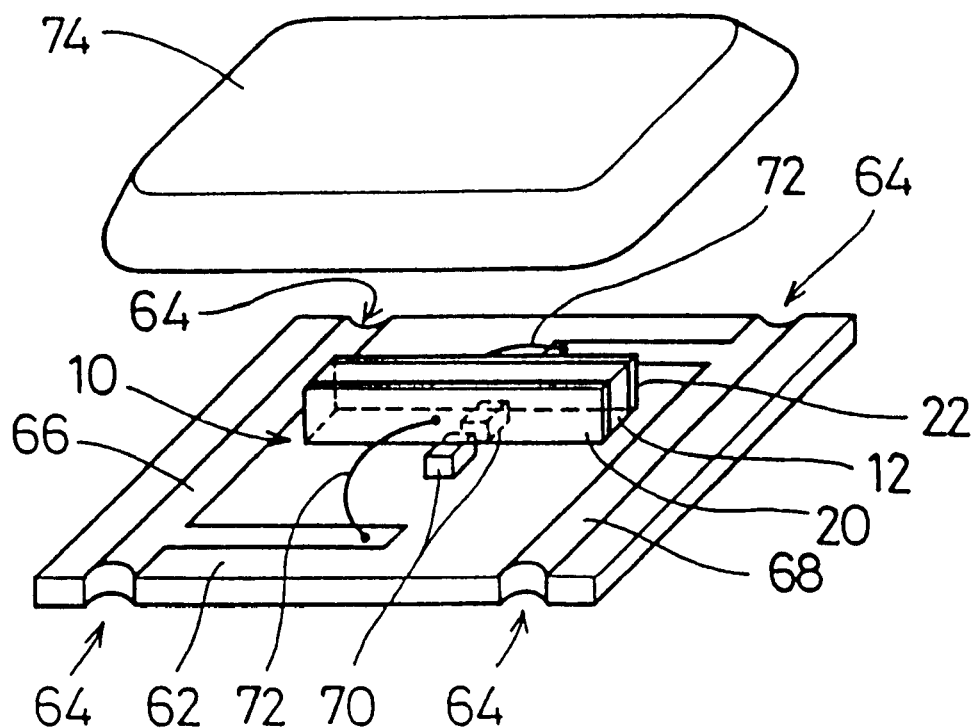
FIG. 26 is a view indicating still another method for mounting the piezoelectric resonator on the insulating substrate.
Figure 27:
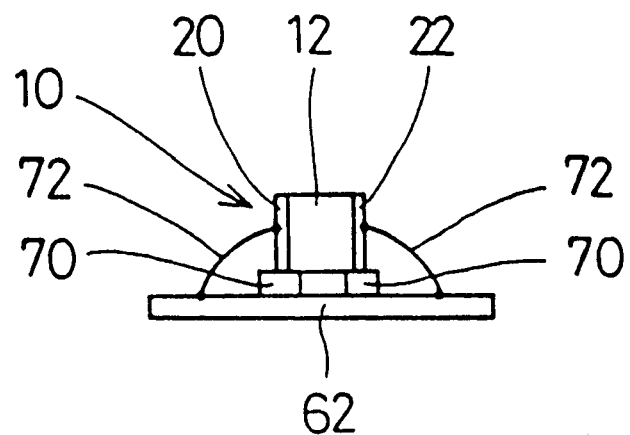
FIG. 27 is a side view showing the method for mounting the piezoelectric resonator, shown in FIG. 26.

The piezoelectric resonator 10 may be mounted on the insulating substrate 62 so that two protrusions 70 made from an electrically conductive material such as electrically conductive adhesive are disposed on both pattern electrodes 66 and 68, and the external electrodes 20 and 22 of the piezoelectric resonator 10 are connected to the two protrusions 70, as shown in FIGS. 24 and 25. The piezoelectric resonator 10 may also be mounted on the insulating substrate 62 in a way shown in FIGS. 26 and 27 in which two protrusions 70 made from an insulating material such as insulating adhesive are formed on the insulating substrate 62 and the external electrodes 20 and 22 are connected to the pattern electrodes 66 and 68 with electrically conductive wire 72. The protrusions 70 may be disposed on the piezoelectric resonator 10 in advance.

Figure 28:
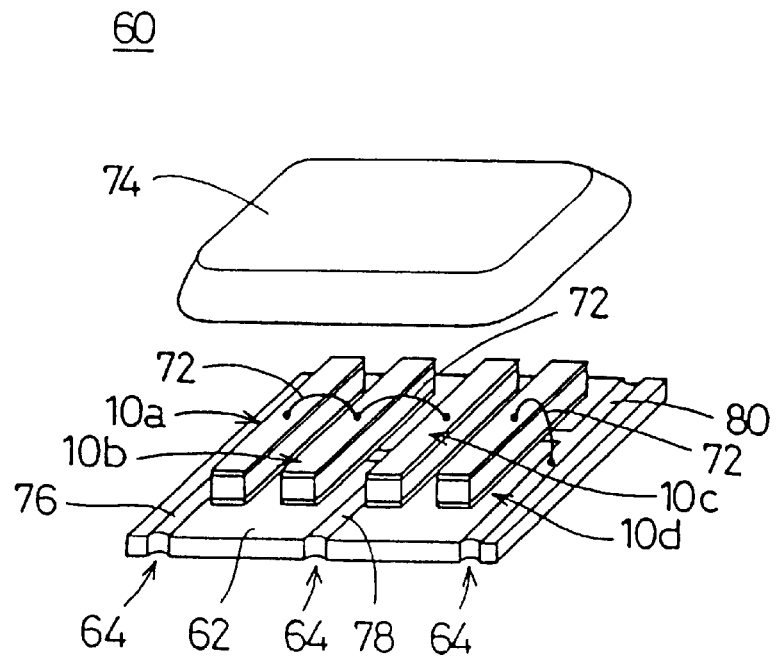
FIG. 28 is an exploded perspective view of a ladder filter using the piezoelectric resonators according to the preferred embodiments of the present invention.
Figure 29:
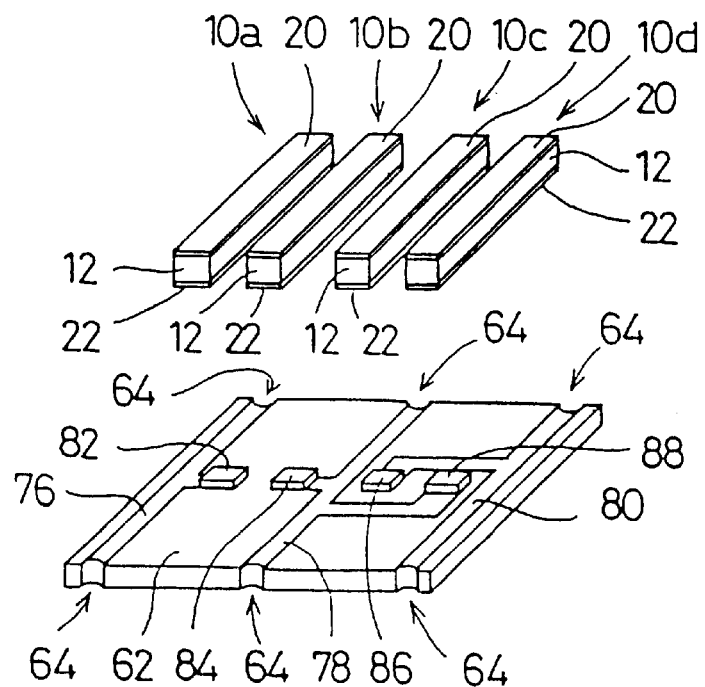
FIG. 29 is a perspective view of an insulating substrate and the piezoelectric resonators in the ladder filter shown in FIG. 28.

A ladder filter can be made using a plurality of the piezoelectric resonators 10. As shown in FIGS. 28 and 29, three pattern electrodes 76, 78, and 80 are disposed on an insulating substrate 62 serving as a support member in an electronic component 60. Protrusions 82 and 86 serving as mounting members are formed with electrically conductive adhesive on both-end pattern electrodes 76 and 80. On the center pattern electrode 78, two protrusions 84 and 88 serving as mounting members are formed with electrically conductive adhesive.

One external electrode 22 for each of piezoelectric resonators 10a, 10b, 10c, and 10d is mounted to each of the protrusions 82, 84, 86, and 88, respectively. The protrusions 82, 84, 86, and 88 may be disposed on the piezoelectric resonators 10*a*, 10*b*, 10*c*, and 10*d* in advance. The other external electrodes 20 for piezoelectric resonators 10*a*, 10*b*, and 10*c* are preferably connected to each other with electrically conductive wire 72. The other external electrode 20 of a piezoelectric resonator 10*d* is preferably connected to the pattern electrode 80 with electrically conductive wire 72. A metal cap 74 is placed on the insulating substrate 62.

Figure 30:
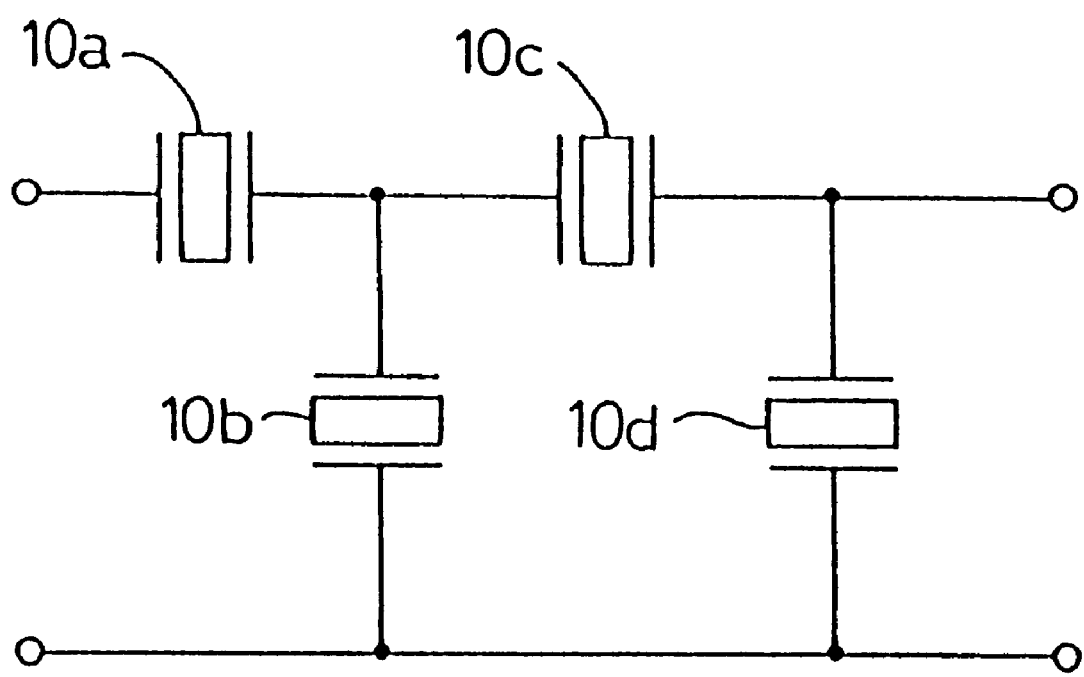
FIG. 30 is an equivalent circuit diagram of the ladder filter shown in FIGS. 28 and 29.

The electronic component 60 is used as a ladder filter having a ladder-shaped circuit shown in FIG. 30. Two piezoelectric resonators 10*a* and 10*c* serve as series resonators and the other two piezoelectric resonator 10*c* and 10*d* serve as parallel resonators. In such a ladder filter, the parallel piezoelectric resonators 10*b* and 10*d* are designed to have substantially larger capacitances than the series piezoelectric resonators 10*a* and 10*c*.

Attenuation in the ladder filter is determined by the capacitance ratio between the series resonators and the parallel resonators. In this electronic component 60, the capacitance can be adjusted by changing the number of laminated layers used in the piezoelectric resonators 10*a* to 10*d*. Therefore, a ladder filter having a larger attenuation with fewer resonators is implemented by changing the capacitances of the piezoelectric resonators, as compared with a case where the conventional unstiffened piezoelectric resonators are used. Since the piezoelectric resonators 10*a* to 10*d* have a larger $\Delta F$ than the conventional piezoelectric resonator, a wider transmission frequency band is achieved as compared with the conventional piezoelectric resonator.

Figure 31:
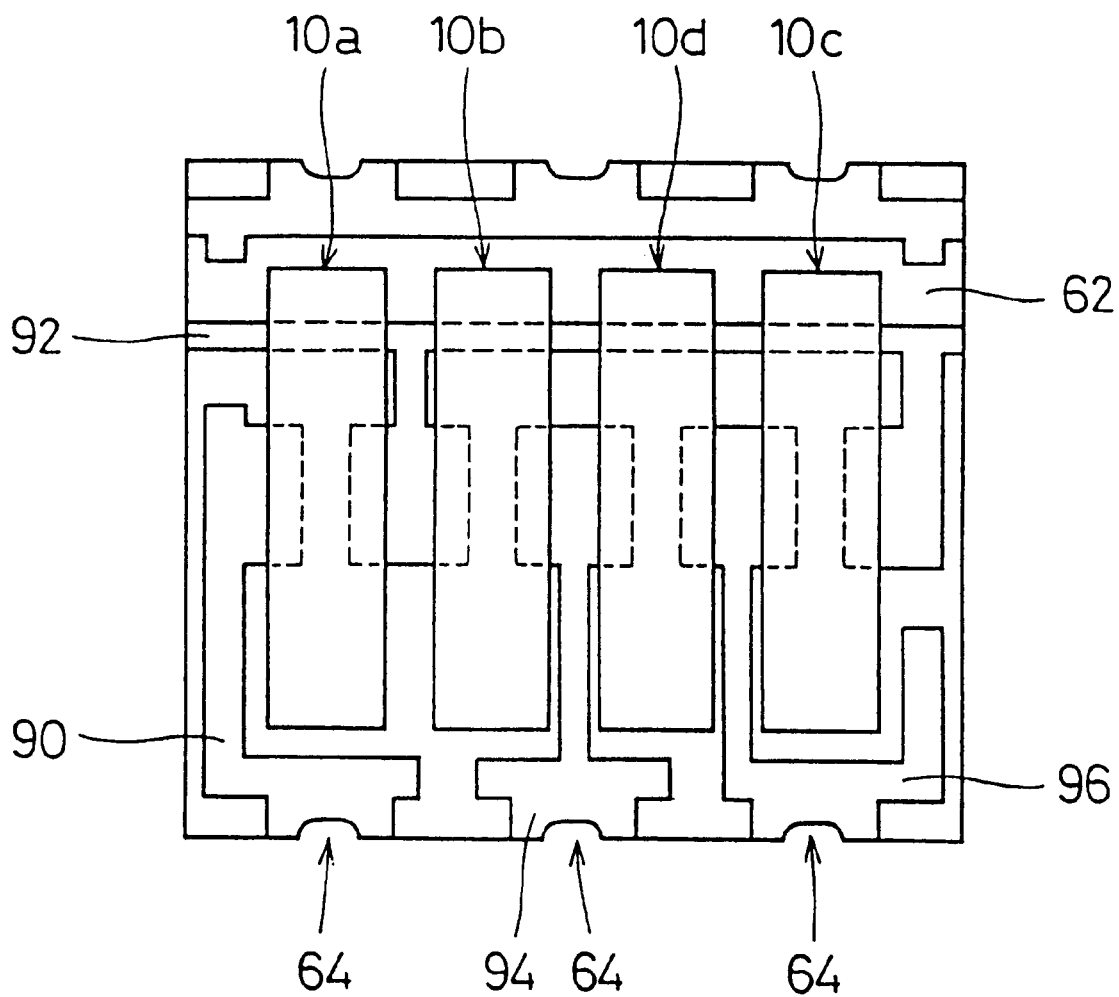
FIG. 31 is a plan of the main portion of another ladder filter using piezoelectric resonators according to the preferred embodiments of the present invention.
Figure 32:
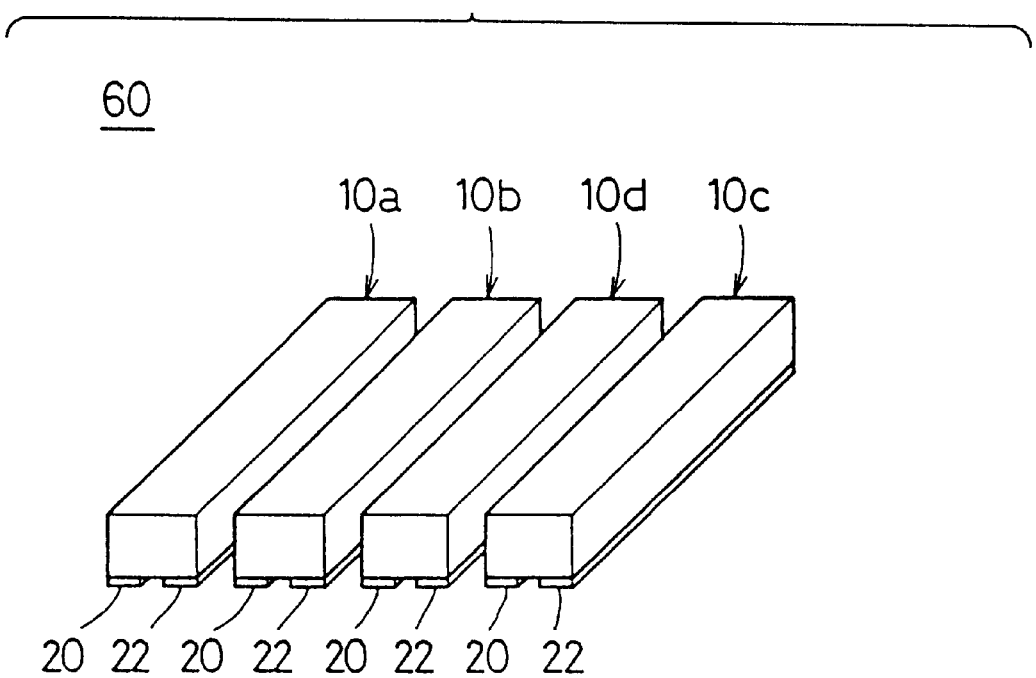
FIG. 32 is an exploded perspective view of the main portion of the ladder filter shown in FIG. 31.
Figure 32:
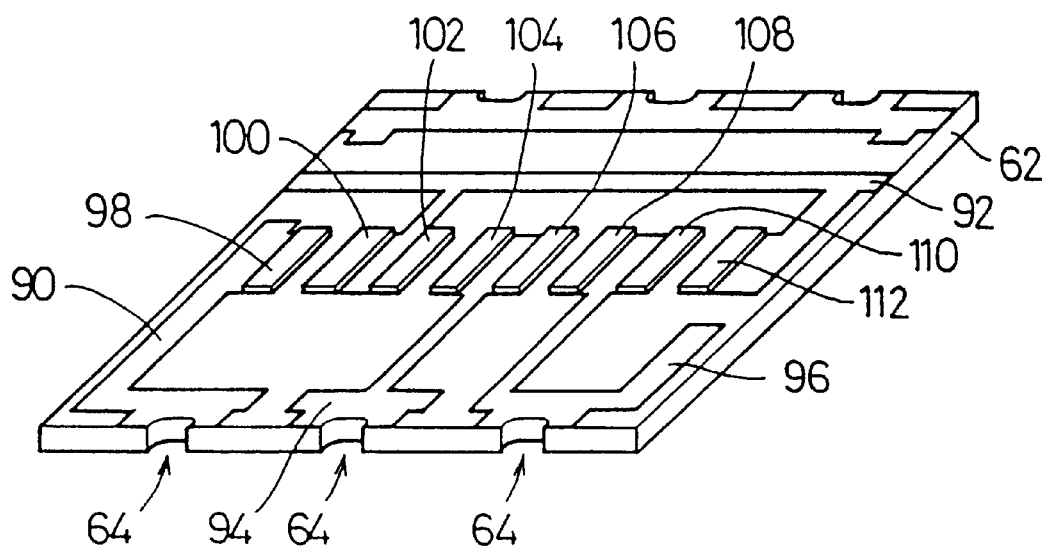

FIG. 31 is a plan view of the main section of a ladder filter having a ladder-shaped circuit. FIG. 32 is an exploded perspective view of the main section. In the electronic component 60 shown in FIGS. 31 and 32, four pattern electrodes 90, 92, 94, and 96 are disposed on an insulating substrate 62 serving as a support member. Five lands disposed in line at a certain interval are provided on the pattern electrodes 90, 92, 94, and 96. The first land, which is closest to an end of the insulating substrate 62, is provided on the pattern electrode 90, the second and fifth lands are disposed on the pattern electrode 92, the third land is disposed on the pattern electrode 94, and the fourth land is disposed on the pattern electrode 96. Mounting members are arranged in line at a certain interval using electrically conductive adhesive on the five lands: one protrusion 98 on the first land; two protrusions 100 and 102 on the second land; two protrusions 104 and 106 on the third land; two protrusions 108 and 110 on the fourth land, and one protrusion 112 on the fifth land.

The external electrodes 20 and 22 of piezoelectric resonators 10*a*, 10*b*, 10*c*, and 10*d* are mounted on these protrusions 98, 100, 102, 104, 106, 108, 110, and 112 to form a ladder-shaped circuit shown in FIG. 30. The protrusions may be disposed in advance on the piezoelectric resonators 10*a*, 10*b*, 10*c*, and 10*d*. Then, a metal cap (not shown) is placed on the insulating substrate 62.

The electronic component shown in FIGS. 31 and 32 differs from the electronic component shown in FIGS. 28 and 29 in that two electrodes of adjacent piezoelectric resonators are mounted on two protrusions which are located on the same land. Therefore, the two electrodes of adjacent piezoelectric resonators do not need to be insulated and thus adjacent resonators can be disposed closely, enabling a more compact component.

Figure 33:
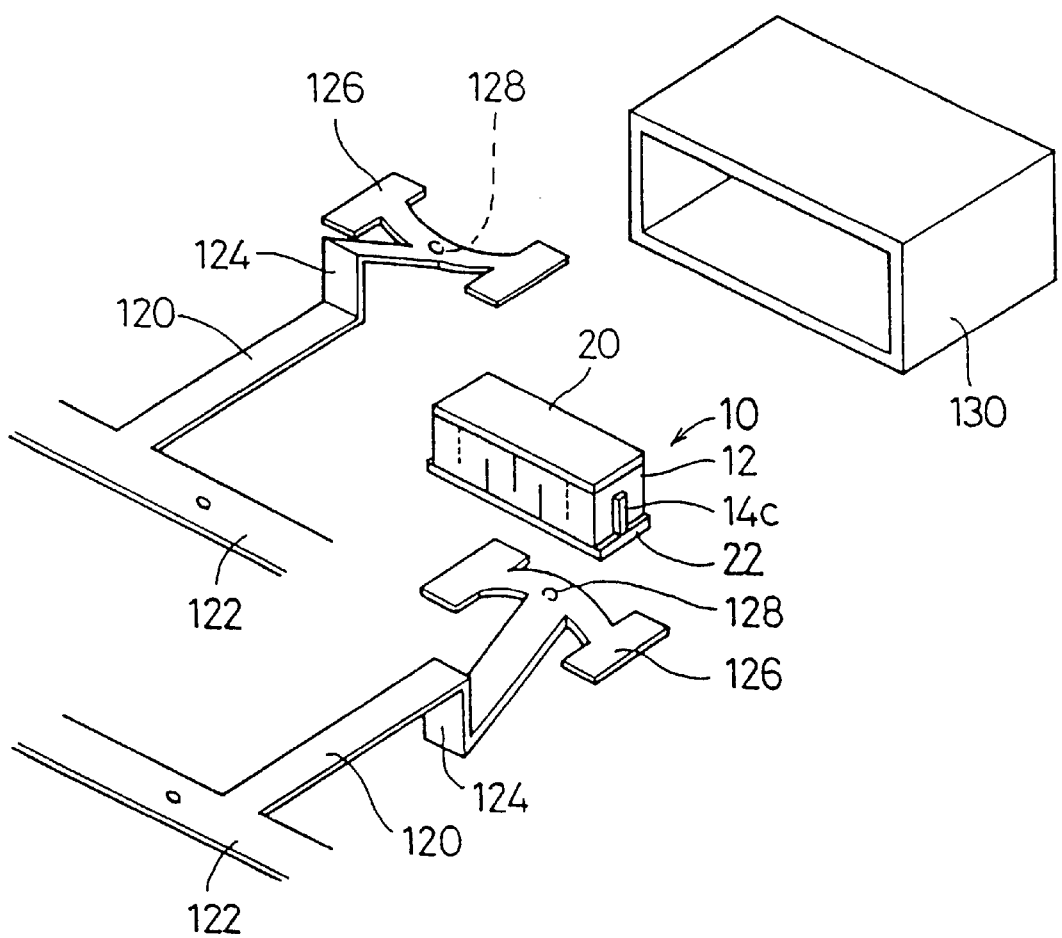
FIG. 33 is an exploded perspective view of a two-terminal electronic component using a piezoelectric resonator according to the preferred embodiments of the present invention.
Figure 34:
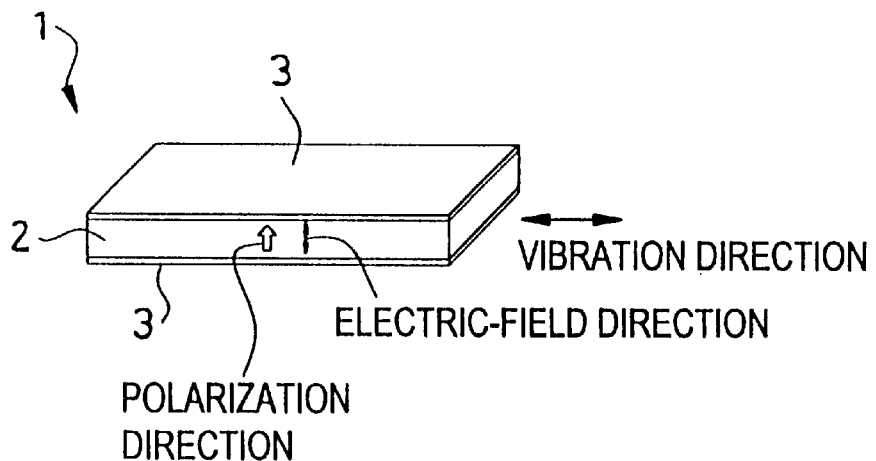
FIG. 34 is a perspective view of a conventional piezoelectric resonator.
Figure 35:
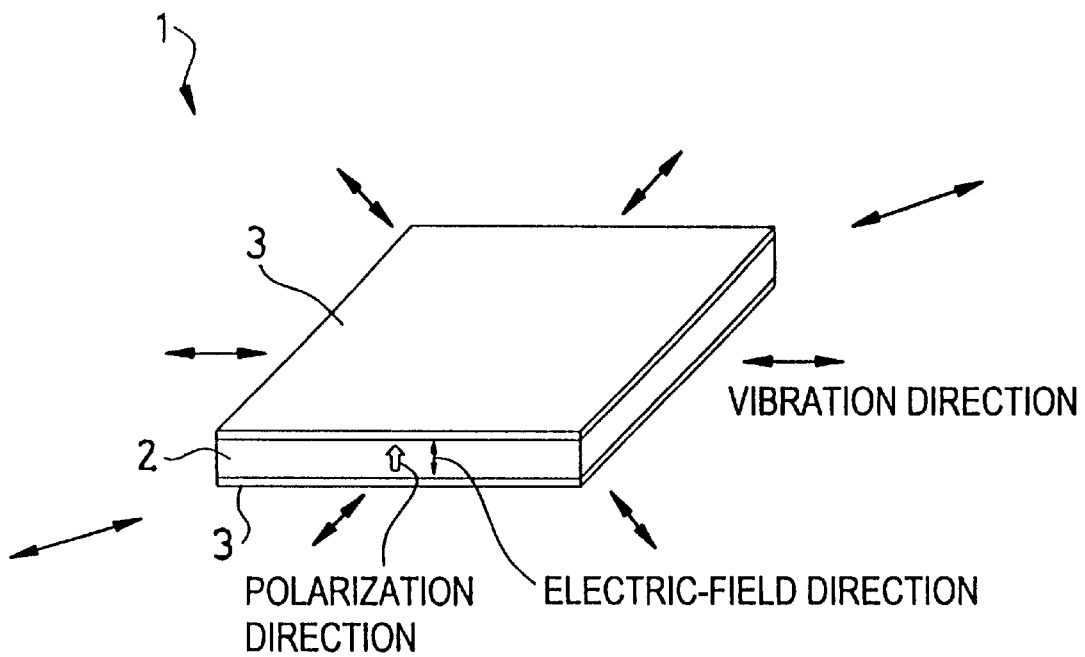
FIG. 35 is a perspective view of another conventional piezoelectric resonator.

A two-terminal electronic component 60 such as a ceramic resonator and a ceramic discriminator can be produced with a piezoelectric resonator 10 as shown in FIG. 33.

Two terminals 120 made from an electrically conductive material are prepared to produce such a two-terminal component 60. These terminals 120 are formed such that they extend from hoops 122. Practically, a plurality of terminals 120 are formed on each hoop 122 in line. A terminal 120 is provided with a fold section 124 at the intermediate portion and an H-shaped support member 126 at the end. The support member 126 is bent and is provided with a protruded mounting member 128 at the center. The two terminals 120 are disposed such that their mounting members 128 are arranged opposite each other.

The piezoelectric resonator 10 is supported between the mounting members 128. The mounting members 128 abut against the external electrodes 20 and 22 substantially at the center of the piezoelectric resonator 10 in the longitudinal direction. Since the terminals 120 have fold sections 124, which serve as spring elements, the piezoelectric resonator 10 is spring-supported by the terminals 120. A case 130 having an opening at one end is placed on the piezoelectric resonator 10. The opening of the case 130 is preferably closed with paper and then resin-sealed. The terminals 120 are cut from the hoops 122 to complete the electronic component 60. The electronic component 60 having a shape other than a chip-shape can thus be made.

In each of the above-described piezoelectric resonators, one piezoelectric layer is provided between two adjacent electrodes. A plurality of piezoelectric layers may be provided.

A dummy electrode which is not connected to an external electrode may be provided for the base member 12.

In each of the above-described piezoelectric resonators, the common or overlapping area of opposing electrodes in the plurality of electrodes increases as the opposing electrodes are located closer to the center of the base member in the longitudinal direction. It is most preferable to have at least one pair of opposing electrodes having a common area different in size from those of the other pairs of opposing electrodes among the plurality of electrodes.

As described above, $\Delta F$ can be easily adjusted in the piezoelectric resonator 10 according to the preferred embodiments of the present invention. Also in the piezoelectric resonator 10 according to the preferred embodiments of the present invention, the frequency difference $\Delta F$ between the resonant frequency and the antiresonant frequency can be substantially increased as compared with a piezoelectric resonator having a uniform electrode area and therefore uniform common or overlapping area of opposing electrodes, and thus a wide-frequency-band piezoelectric resonator is obtained. In addition, a piezoelectric resonator having a small spurious vibration can be obtained according to the preferred embodiments of the present invention. The capacitance of the piezoelectric resonator 10 according to the preferred embodiments of the present invention can be designed as desired by changing the size of common areas of opposing electrodes, the number of piezoelectric layers or electrodes, or the dimensions of the piezoelectric layers in the longitudinal direction of the base member, and thus it is easy to achieve impedance matching with an external circuit. An electronic component having the above-described features of the piezoelectric resonator 10 can also be obtained.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A piezoelectric resonator comprising:
   a base member including a plurality of laminated piezoelectric layers; and
   a plurality of electrodes disposed substantially perpendicularly to a longitudinal direction of said base member and separated by intervals extending in the longitudinal direction of said base member said plurality of electrodes being disposed on surfaces of said plurality of piezoelectric layers which are substantially perpendicular to the longitudinal direction of said base member; wherein
   each of said plurality of piezoelectric layers is polarized in the longitudinal direction of said base member such that a vibration node of the piezoelectric base member is defined approximately at a center portion of the base member during vibration of the base member in a longitudinal vibration mode and at least one pair of electrodes of said plurality of electrodes has a different size electrode area compared to other pairs of opposing electrodes of said plurality of electrodes.

2. A piezoelectric resonator according to claim 1, wherein a size of a common area of opposing electrodes among said plurality of electrodes increases as the opposing electrodes are located closer to a center of the base member in the longitudinal direction thereof.

3. A piezoelectric resonator according to claim 1, further comprising a support member and a mounting member disposed between said support member and said base member.

4. A piezoelectric resonator according to claim 1, wherein at least one pair of opposing electrodes of said plurality of electrodes comprises a plurality of stripes of electrode material.

5. A piezoelectric resonator according to claim 1, wherein at least one pair of opposing electrodes of said plurality of electrodes contains a plurality of holes formed in electrode material forming said at least one pair of opposing electrodes.

6. A piezoelectric resonator comprising:
   a base member including a laminated integral unit containing a plurality of piezoelectric layers and a plurality of electrodes disposed on surfaces of said plurality of piezoelectric layers and being arranged such that a vibration node of the piezoelectric base member is defined approximately at a center portion of the base during vibration of the base member in a longitudinal vibration mode; wherein
   at least one of said plurality of electrodes has a different size than a size of others of plurality of electrodes.

7. A piezoelectric resonator according to claim 6, wherein a size of said plurality of electrodes is larger for electrodes located closer to a center of the base member than for electrodes located farther from said center of the base member.

8. A piezoelectric resonator according to claim 6, further comprising a support member, and a mounting member disposed between said support member and said base member.

9. A piezoelectric resonator according to claim 6, wherein at least one of said plurality of electrodes comprises a plurality of stripes of electrode material.

10. A piezoelectric resonator according to claim 6, wherein at least one of said plurality of electrodes contains a plurality of holes formed therein.

11. An electronic component comprising:
    a piezoelectric resonator including a base member containing a plurality of laminated piezoelectric layers and plurality of electrodes disposed on surfaces of said plurality of piezoelectric layers and being arranged such that a vibration node of the piezoelectric base member is defined approximately at a center portion of the base member during vibration of the base member in a longitudinal vibration mode, wherein at least one of said plurality of electrodes has a different size than a size of others of said plurality of electrodes;
    a support member supporting said base member; and
    a cap disposed on said support member so as to cover said base member.

12. An electronic component according to claim 11, wherein said support member includes an insulating substrate having a pattern electrode disposed on a surface thereof.

13. An electronic component according to claim 11, further comprising at least one mounting member, wherein said base member is mounted on said support member via said mounting member.

14. An electronic component comprising:
    a plurality of piezoelectric resonators disposed in a ladder arrangement, each of said plurality of piezoelectric resonators including a laminated integral unit containing a plurality of laminated piezoelectric layers and a plurality of electrodes disposed on surfaces of said plurality of piezoelectric layers, the laminated integral unit including the piezoelectric layers and the electrodes is arranged such that a vibration node of the laminated integral unit is defined approximately at a center portion of the laminated integral unit during vibration of the base member in a longitudinal vibration mode wherein at least one of said plurality of electrodes has a different size than a size of others of said plurality of electrodes;
    a support member supporting said plurality of piezoelectric resonators; and
    a cap disposed on said support member so as to cover said plurality of piezoelectric resonators.

15. An electronic component according to claim 14, wherein said support member includes an insulating substrate having a pattern electrode disposed on a surface thereof.

16. An electronic component according to claim 14, further comprising a plurality of mounting members, wherein each of said base members of said plurality of piezoelectric resonators is mounted on said support member via a respective one of said plurality of mounting members.

* * * * *